US006943387B2

(12) United States Patent
Ohbu et al.

(10) Patent No.: US 6,943,387 B2
(45) Date of Patent: Sep. 13, 2005

(54) SEMICONDUCTOR DEVICE, MANUFACTURING THEREOF AND POWER AMPLIFIER MODULE

(75) Inventors: Isao Ohbu, Sagamihara (JP); Tomonori Tanoue, Machida (JP); Chushiro Kusano, Niza (JP); Yasunari Umemoto, Sayama (JP); Atsushi Kurokawa, Takasaki (JP); Kazuhiro Mochizuki, Tokyo (JP); Masami Ohnishi, Hachioji (JP); Hidetoshi Matsumoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 105 days.

(21) Appl. No.: 10/409,455

(22) Filed: Apr. 9, 2003

(65) Prior Publication Data

US 2003/0218185 A1 Nov. 27, 2003

(30) Foreign Application Priority Data

Apr. 10, 2002 (JP) .................................... P2002-107286
Mar. 10, 2003 (JP) .................................... P2003-063047

(51) Int. Cl.[7] .............................................. H01L 31/072
(52) U.S. Cl. ........................ 257/200; 257/197; 257/198
(58) Field of Search ................................ 257/200, 197, 257/198, 565, 567, 575, 578, 580, 582, 586, 592, 591

(56) References Cited

U.S. PATENT DOCUMENTS

| | | | | |
|---|---|---|---|---|
| 6,045,614 A * | 4/2000 | de Lyon et al. | ............ | 117/100 |
| 6,462,362 B1 * | 10/2002 | Miyoshi | ..................... | 257/198 |
| 6,472,679 B1 * | 10/2002 | Takayama et al. | ............ | 257/12 |
| 6,472,680 B1 * | 10/2002 | Takayama et al. | ............ | 257/14 |
| 6,521,917 B1 * | 2/2003 | Takayama et al. | .......... | 257/103 |
| 6,576,937 B2 * | 6/2003 | Takazawa et al. | .......... | 257/197 |
| 6,627,925 B1 * | 9/2003 | Finlay | ........................ | 257/197 |
| 6,639,300 B2 * | 10/2003 | Wada | ......................... | 257/539 |
| 6,677,625 B2 * | 1/2004 | Yanagihara et al. | ........ | 257/200 |
| 2001/0010388 A1 | 8/2001 | Yanagihara et al. | ........ | 257/565 |
| 2003/0218185 A1 * | 11/2003 | Ohbu et al. | ................. | 257/197 |

FOREIGN PATENT DOCUMENTS

| | | | |
|---|---|---|---|
| EP | 1 134 809 | 9/2001 | |
| EP | 1353384 A2 * | 10/2003 | ......... H01L/29/737 |
| JP | 5-3204 | 1/1993 | |
| JP | 10-242161 | 9/1998 | |
| JP | 2001-189319 | 7/2001 | |
| JP | 2001-230261 | 8/2001 | |
| JP | 2001-217404 | 8/2002 | |

OTHER PUBLICATIONS

Horio, Kazushige et al., "Analysis of Carrier–Blocking Effect in A1GaAs/GaAs HBT's with Insulating External Collector and Design Criteria for Collector–Up HBT's," *IEEE Transactions on Electron Devices*, vol. 42, No. 11, Nov. 1995, pp. 1897–1902.

* cited by examiner

*Primary Examiner*—Laura M. Schillinger
(74) *Attorney, Agent, or Firm*—Miles & Stockbridge P.C.

(57) ABSTRACT

In a semiconductor device using an emitter top heterojunction bipolar transistor having a planar shape in a ring-like shape, a structure is provided in which a base electrode is present only on an inner side of a ring-like emitter-base junction region. This allows reduction of base/collector junction capacitance per unit emitter area, whereby a semiconductor device having high power adding efficiency and high power gain suitable for a power amplifier can be realized. Further, in a multistage power amplifier including first and second amplifier circuits each having one or more of bipolar transistors, a bipolar transistor in the first amplifier circuit uses an emitter having a planar shape in a rectangular shape, and a bipolar transistor in the second amplifier circuit uses an emitter having a ring-like shape and a base electrode only on the inner side of the emitter.

4 Claims, 27 Drawing Sheets

SEMICONDUCTOR DEVICE, MANUFACTURING THEREOF AND POWER AMPLIFIER MODULE

BACKGROUND OF THE INVENTION

1. Field of the Invention

The present invention relates to a semiconductor device using a heterojunction bipolar transistor (hereinafter, described as HBT) and a method of fabricating the semiconductor, particularly to a semiconductor device for a power amplifier for a mobile communicating machine and a method of fabricating the semiconductor device.

Further, the present invention relates to a power amplifier reducing temperature dependency of power gain and enabling high power conversion efficiency.

2. Related Art

In recent years, with rapid growth of demand of a mobile communicating machine, research and development on a power amplifier used for the communicating machine has intensively been carried out. Examples of semiconductor transistors used for a power amplifier for a mobile communicating machine include GaAsHBT, GaAs field effect transistor (hereinafter, described as FET), and SiMOS (Metal-Oxide-Semiconductor) FET. Among them, GaAsHBT is centrally used as a transistor for a power amplifier for a mobile communicating machine since the transistor is provided with characteristics of being excellent in linearity of an input/output characteristic, operated only by a positive power source, dispensed with circuit or part required for generating a negative power source, having a high output power density and having a small chip area to thereby save space and reduce cost.

It is indispensable to reduce base/collector capacitance per unit emitter area to promote performance of a power amplifier using GaAsHBT, particularly to promote power added efficiency, power gain and the like. For that purpose, it is necessary to reduce a ratio r of a base/collector junction area per an emitter/base junction area. A collector top HBT structure is generally known as a method for reducing r and the structure is disclosed in IEEE Transaction on Electron Devices Vo. 42 No. 11 (1995) pp.1897–1902).

FIG. 3 shows a vertical sectional structure of a collector top HBT fabricated by the prior art noted above. As is apparent from the figure, r=1 can be realized, however, in comparison with an emitter top HBT structure, there are increased steps of forming a parasitic emitter/base high resistance region 35, specifically, steps of ion-implanting boron or the like and annealing, the fabricating method becomes complicated and therefore, there poses a problem which amounts to an increase in cost of a semiconductor device.

Therefore, in order to promote the performance of a semiconductor device while avoiding an increase in cost, it is pertinent to achieve a reduction in r by changing layout of the emitter top HBT. In the case of HBT of the prior art using a rectangular emitter shape, it has been difficult to realize r<2.5. This is because a base electrode and through holes connecting the base electrode and wiring restruct a rate of reducing the base/collector junction area. In contrast thereto, r can be reduced by constituting the base electrode only by a base through hole region and changing a planar shape of emitter/base junction from the conventional rectangular shape to a ring-like structure. Such a ring-like emitter structure has been proposed in an Si bipolar transistor avoiding an erroneous operation of software error or the like caused by irradiation of α-rays and disclosed in JP-A-5-3204. Although in the prior art of the Si bipolar transistor, the collector electrode is arranged on an inner side of the ring-like emitter/base junction, as shown by a plan structure view of FIG. 1, r<2.5 can be realized by arranging the base electrode in place of the collector electrode and arranging the collector electrode on an outer side of the ring-like emitter/base junction.

It is a first object of the present invention to provide a semiconductor device using HBT satisfying r<2.5.

It is a second object of the present invention to provide a semiconductor device using HBT satisfying r<2.0.

It is a third object of the invention to provide a method of fabricating HBT satisfying r<1.5.

It is a fourth object of the present invention to provide a semiconductor device having a high power added efficiency and a high power gain and being suitable for a power amplifier.

Next, an explanation will be given of a situation heretofore with regard to a power amplifier. In recent years, with rapid growth of demand of mobile communicating apparatus, research and development on a power amplifier used in a communicating machine has intensively carried out. Examples of semiconductor transistors used in a power amplifier for a mobile communicating machine include a heterojunction bipolar transistor (hereinafter, abbreviated as HBT), a field effect transistor (hereinafter, abbreviated as FET), and SiMOS (Metal-Oxide-Semiconductor) FET. Among them, HBT is provided with characteristic of being excellent in linearity of an input/output characteristic, operated only by a positive power source, dispensed with circuit or part for generating a negative power source, having a high power output density and a small chip area to thereby save space and reduce cost. Therefore, the transistor is centrally used as a transistor for a power amplifier for a mobile communicating machine.

To realize high performance formation of a power amplifier for a mobile communicating machine, high performance formation of HBT constituting a basic device thereof is indispensable. For that purpose, it is necessary to reduce base/collector capacitance. A technology of using HBT having a ring-like emitter shape is known as a means therefor in, for example, JP-A-2001-189319.

The technology disclosed in JP-A-2001-189319 has a difficulty of high temperature dependency of power gain. FIG. 41 shows a result of measuring temperature dependency of power gain of HBT. FIG. 41 shows respective results of HBT having a ring-like emitter (hereinafter, abbreviated as ring-like emitter HBT) and HBT having a rectangular emitter (hereinafter, abbreviated as rectangular emitter HBT). In both of the ring-like emitter HBT and the rectangular emitter HBT, a total emitter area is designed to be equal to about 800 $\mu m^2$. Further, the ring-like emitter HBT is constituted by connecting basic HBT having an emitter area of 132 $\mu m^2$ in 6 rows in parallel and the rectangular emitter HBT is constituted by connecting basic HBT having an emitter area of 108 $\mu m^2$ in 8 rows in parallel. Measuring conditions are such that collector voltage is 3.5 V and frequency is 1.9 GHz. The respective temperature coefficients of power gain of the ring-like emitter HBT and the rectangular emitter HBT are −0.012 dB/° C. and −0.006 dB/° C. Therefore, when a power amplifier having two stages constitution is formed, in the case of the ring-like emitter HBT, the temperature coefficient of power gain is −0.024 dB/° C. and in the case of the rectangular emitter HBT, the temperature coefficient of power gain is −0.012 dB/° C.

A difference of the temperature dependencies of power gain of the ring-like emitter HBT and the rectangular emitter HBT is caused by temperature dependency of base resistance. The base resistance is increased with temperature rise. Meanwhile, the base resistance of the ring-like emitter HBT is larger than that of the rectangular emitter HBT. Therefore, an amount of change in the base resistance with a change in temperature of the ring-like emitter HBT becomes larger than that of the rectangular emitter HBT. As a result, in the case of the ring-like emitter HBT, mismatch with a matching circuit in view of high frequency is increased with temperature rise and the temperature dependency of power gain is also increased.

Based on the background, it is a fifth object of the present invention to provide a high performance power amplifier having low temperature dependency of power gain.

In addition thereto, it is a sixth object of the present invention to provide a method of fabricating a high performance power amplifier having low temperature dependency of power gain.

SUMMARY OF THE INVENTION

In order to achieve the first object of the invention, according to a semiconductor device related to the invention, as mentioned in the problem to be resolved by the invention, there is provide a semiconductor device using a bipolar transistor formed above a semiconductor substrate and having an emitter/base junction region having a planar shape in a ring-like shape. The semiconductor substrate is a zinc blende type semiconductor substrate having a (100) (±5 degrees) face, the bipolar transistor is an emitter top type HBT and a base electrode of the HBT is present only on an inner side of the ring-like emitter/base junction region in the ring-like shape.

Further, in order to achieve the second object of the invention, (1) at an outer periphery of an emitter/base junction region of HBT achieving the first object of the invention, a side in parallel with [011] (±5 degrees) is not present, or (2) in a semiconductor device using an emitter top type HBT formed above a zinc blende type semiconductor substrate having a (100) (±5 degrees) face at a surface thereof and having a planar shape in a ring-like shape, a minimum value of a distance, in a [01-1] direction, between an outer periphery of a base/collector junction region of the HBT and an outer periphery of the emitter/base junction region is larger than a minimum value of the distance in [011] direction, (3) in a semiconductor device using an emitter top type HBT formed above a zinc blende type semiconductor substrate having a (100) (±5 degrees) face at a surface thereof and having an emitter/base junction region having a planar shape in a nonring-like shape, a minimum value of a distance, in a [01-1] direction, between an outer periphery of a base/collector junction region of the HBT and an outer periphery of the emitter/base junction region is larger than a minimum value of the distance in [011] direction. Here, that a side in parallel with [011] (±5 degrees) is not present at the outer periphery of the emitter/base junction region is that when the planar shape is a polygonal shape, respective sides thereof are not in parallel with [011] (±5 degrees) and includes a case that the planar shape is a circle, an ellipse or a portion thereof (semicircle or the like).

Further, in order to achieve the third object, HBT achieving 2(1)-aspect of the invention is fabricated by successively processing steps of forming an emitter electrode, forming an emitter mesa constituting a mask by the emitter electrode, forming a base electrode, forming an insulating film side wall to side faces of the emitter electrode and the emitter mesa and forming a base mesa constituting a mask by the emitter electrode and the insulating film side wall.

Further, in order to achieve the fourth object of the invention, HBT achieving the first, the second and the third objects of the invention is constituted by a monolithic microwave integrated circuit (hereinafter, described as MMIC) integrated with at least one kind of a capacitor element, a resistor element, an inductance element and a diode.

Next, an explanation will be given of a power amplifier module.

The gist for achieving the fifth object of the invention is as follows: That is, there is provided a power amplifier module including a first amplifier circuit constituted by one or more of bipolar transistors connected in parallel and a second amplifier circuit constituted by one or more of bipolar transistors connected in parallel by multiple stage connection wherein the bipolar transistor provided to the first amplifier circuit is a bipolar transistor having base electrodes on both sides of an emitter electrode in a planar arrangement, and the bipolar transistor provided to the second amplifier circuit is a bipolar transistor including a portion in which a base electrode, an emitter electrode and a collector electrode are successively arranged.

A planar shape of the emitter electrode of the bipolar transistor included by the first amplifier circuit having the base electrodes on both sides of the emitter electrode is a quadrangular shape in a representative shape. Further, a rectangular shape is frequently used.

Further, the bipolar transistor of the second amplified circuit ordinarily includes a portion in which a base electrode, an emitter electrode and a collector electrode are successively arranged and the emitter electrode includes a portion surrounding at least a portion of the base electrode. It is general that the planar shape of the emitter electrode of the bipolar transistor includes a closed planar diagram having a space in the inside thereof and having at least one of a curved portion and a linear portion or a portion of the closed planar diagram.

Further, the base electrode is arranged at a space portion in the inside of the planar diagram of the emitter electrode.

Further, the planar shape of the emitter electrode of the bipolar transistor included by the second amplifier circuit is representatively a ring-like shape or a shape of a portion of a ring-like shape. As mentioned above, an outer shape of a closed polygonal shape may be used as the ring-like shape.

Further, the first amplifier circuit and the second amplifier circuit may respectively be constituted at separate semiconductor substrates or may be constituted at one semiconductor substrate. This is selected by various items requested in designing a total of the module.

Whether the first or the second amplifier circuit is used at a driver stage or an output stage in the power amplifier module is sufficiently selected by various items required in designing a total of the module.

Further, a representative example of a material of an emitter layer material of the bipolar transistor is at least one selected from a group constituting of InGaP, AlGaAs, InP and InGaAlAs.

In order to achieve the sixth object of the invention, fabrication is carried out by successively processing steps of forming an emitter electrode, forming an emitter mesa, forming a base electrode, forming a base mesa and forming a collector electrode. The steps are exemplified further specifically in the following.

There are provided a method of fabricating a power amplifier module comprising a step of forming, in a stacked manner, at least a semiconductor layer for a collector, a semiconductor layer for a base above the semiconductor layer for the collector and a semiconductor layer for an emitter above the semiconductor layer for the base above a semiinsulating substrate, a step of forming an emitter electrode having a desired shape above the semiconductor layer for the emitter, a step of forming an emitter region by fabricating the semiconductor layer for the emitter in a mesa shape, a step of forming a base electrode above the semiconductor layer for the base, a step of forming a base region by fabricating the semiconductor layer for the base in a mesa shape mounted with a region including the emitter region in a planar region, and a step of forming a collector electrode and in the steps of fabricating the emitter electrode and the base electrode. The invention is provided with the following characteristics.

More specifically, the bipolar transistor region included by the first amplifier circuit is planarly arranged with an electrode having the base electrodes on both sides of the emitter electrode in a planar arrangement. Meanwhile, the bipolar transistor region included by the second amplifier circuit includes a portion successively arranged with the base electrode, the emitter electrode and the collector electrode in a planar arrangement and the emitter electrode is fabricated in a planar arrangement of an electrode having a portion in which the emitter electrode surrounds at least a portion of the base electrode. The planar shape and arrangement of the respective electrodes is similar to that in the explanation of the module structure.

In this way, the power amplifier module of the application can enable high power conversion efficiency while sufficiently reducing temperature dependency of power gain under a restriction in constituting the power amplifier module by using a semiconductor element formed above an insulating or a semiinsulating substrate.

PREFERRED EMBODIMENTS OF THE INVENTION

Embodiment 1

A description will below be made of an emitter top HBT which is a first embodiment of the invention in reference to FIG. 1, FIG. 11, FIG. 12 and FIG. 13.

Figure 1:
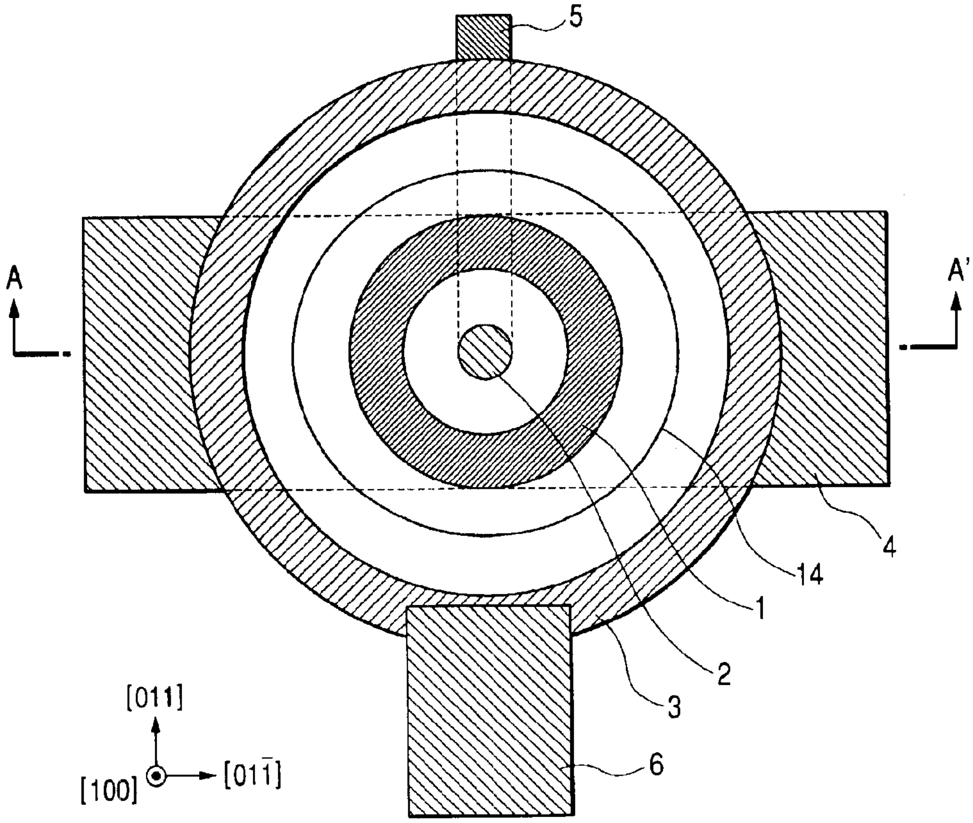
FIG. 1 is a plan structure view of an emitter top HBT used in a semiconductor device which is a first embodiment of the invention.

FIG. 1 is a plan structure view of an emitter top HBT which is a first embodiment of the invention. A base electrode 2 is arranged on an inner side of a ring-like emitter electrode 1 and a collector electrode 3 is arranged on an outer side thereof. Further, emitter wiring 4 (not illustrated on an inner side of the collector electrode 3), base wiring 5 (not illustrated on the inner side of the collector electrode 3) and collector wiring 6 are connected to the emitter electrode 1, the base electrode 2 and the collector electrode 3 respectively via through holes (not illustrated). The ratio r is determined by a distance between a base mesa outer periphery 14 and the emitter electrode 1 and when 1.0 $\mu$m is considered as matching allowance of photolithography, in the case of the emitter electrode having a width of, for example, 4.5 $\mu$m, r=2.5 or smaller can be realized. Further, according to the embodiment, considering a case of fabricating HBT by using dry etching, the matching allowance is set to 1.0 $\mu$m. When the matching allowance is set to a value smaller than 1.0 $\mu$m, due to influence of dry etching damage on the base mesa surface 14, electrons flowing from the emitter to the collector via the base are recombined on the base mesa 14 and a problem of deteriorating a current gain is brought about. Although the influence of the damage can be avoided by using wet etching, the detailed description thereof will be given in Embodiments 2 and 3.

Figure 11:
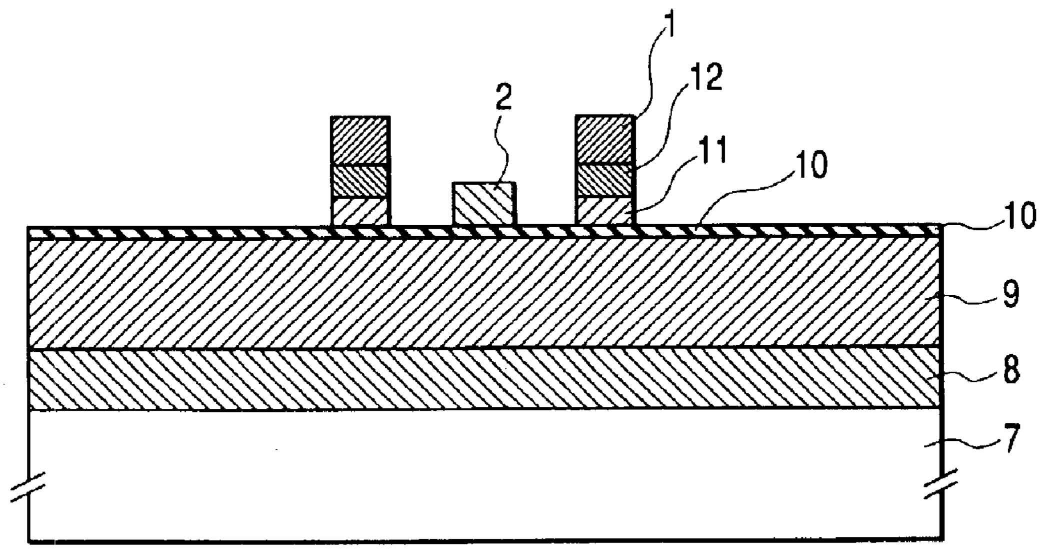
FIG. 11 is an explanatory view of a step of fabricating the emitter top HBT used in the semiconductor device which is the first embodiment of the invention.
Figure 12:
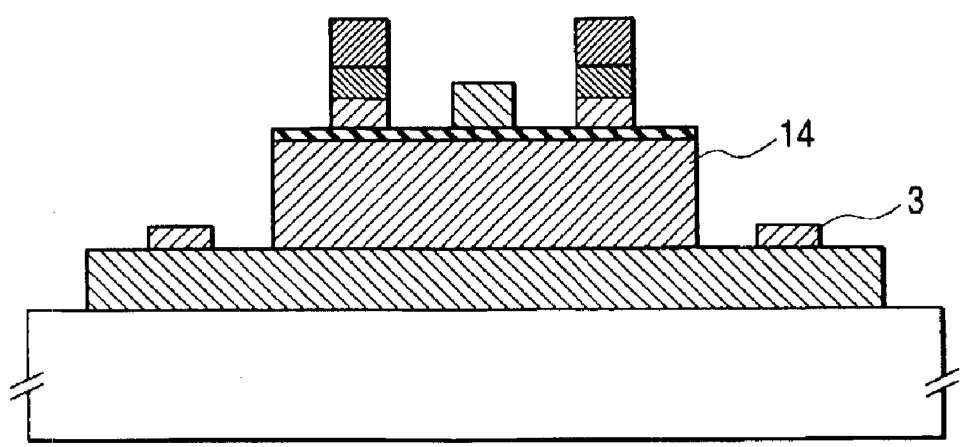
FIG. 12 is an explanatory view of a step of fabricating the emitter top HBT used in the semiconductor device which is the first embodiment of the invention.

FIGS. 11 and 12 show fabricating steps when HBT shown in FIG. 1 is fabricated by dry etching. First, a highly doped n type GaAs subcollector layer (Si concentration $5\times10^{18}$ cm$^{-3}$, film thickness 0.6 $\mu$m) 8, an n type GaAs collector layer (Si concentration $1\times10^{16}$ cm$^{-3}$, film thickness 0.8 $\mu$m) 9, a p type GaAs base layer (C concentration $3\times10^{19}$ cm$^{-3}$, film thickness 70 nm) 10, an n type InGaP emitter layer (InP molar ratio 0.5, Si concentration $3\times10^{17}$ cm$^{-3}$, film thickness 0.2 $\mu$m) 11, and an n type InGaAs cap layer (InAs molar ratio 0.5, Si concentration $4\times10^{19}$ cm$^{-3}$, film thickness 0.2 $\mu$m) 12 are made to grow above a semiinsulating GaAs substrate (surface (100) (±5 degrees) face) 7 by a metal organic vapor phase epitaxial growth method. Thereafter, WSi (Si molar ratio 0.3, film thickness 0.3 $\mu$m) is deposited on an entire face of a wafer by using a high frequency sputtering method and the emitter electrode 1 is formed by dry etching using photolithography and $CF_4$. Further, with the emitter electrode 1 as a mask, the InGaAs cap layer 12 and the InGaP emitter layer 11 are subjected to dry etching by plasma of $CH_4$ and $Cl_2$ and the GaAs base layer 10 is exposed. Further, the Ti (film thickness 50 nm)/Pt (film thickness 50 nm)/Au (film thickness 200 nm) base electrode 2 is formed by a lift-off method (FIG. 11).

Figure 5:
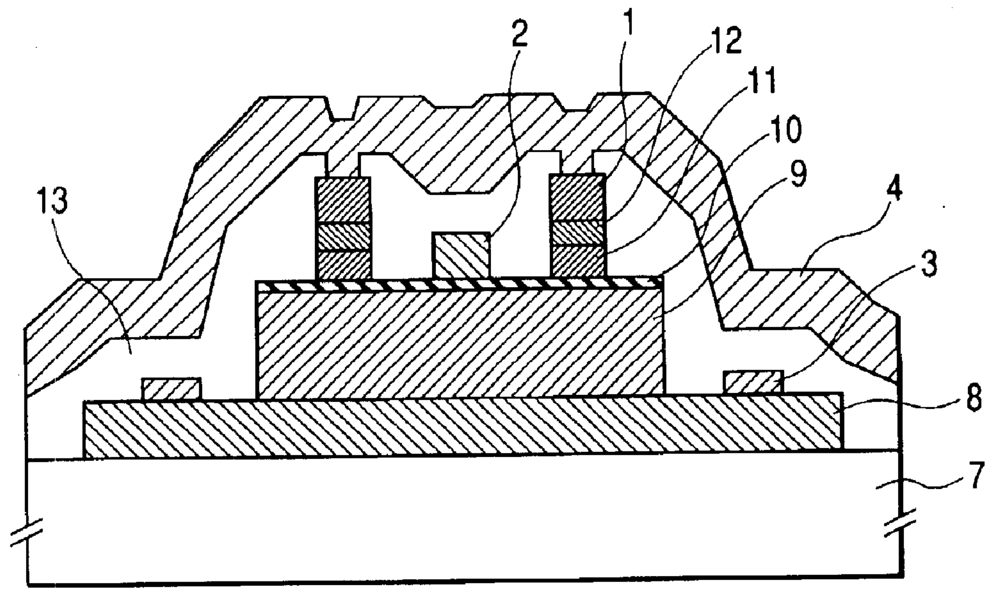
FIG. 5 is a vertical sectional structure view of the emitter top HBT used in the semiconductor devices which are the first and the second embodiment (a face taken along line B–B' of FIG. 4) of the invention.

Thereafter, the GaAs base layer 10 and the GaAs collector layer 9 are subjected to dry etching by using photolithography and $C_2F_6$ and $SF_6$ to form the base mesa 14 and expose the GaAs subcollector layer 8. Further, the AuGe (film thickness 60 nm)/Ni (film thickness 10 nm)/Au (film thickness 200 nm) collector electrode 3 is formed by a lift-off method and alloyed at 350° C. for 30 minutes (FIG. 12). Further, wiring is carried out by using deposition of metal, photolithography and milling and an emitter top HBT having a vertical sectional structure shown in FIG. 5 is fabricated.

Figure 13:
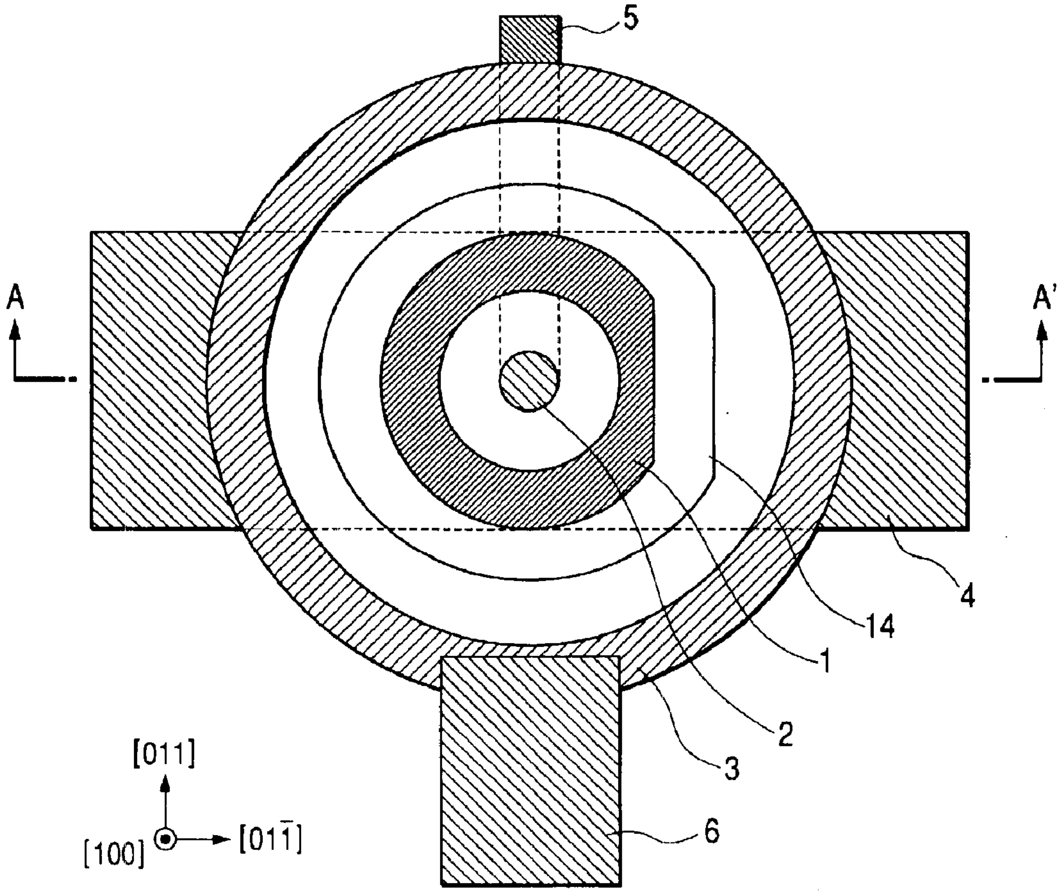
FIG. 13 is a view with regard to an example of a plan structure of an emitter top HBT used in the semiconductor device which is the first embodiment of the invention.

Although according to the embodiment explained in reference to FIG. 1, a ring-like structure in which an emitter/base junction region is circular is shown as a representative example, the ring-like structure is not necessarily to be circular but arbitrary. For example, a ring-like shape shown in FIG. 13 is also possible.

Further, although according to the embodiment, the description has been made of HBT fabricated on the GaAs substrate, the embodiment is applicable to all of HBT formed above a zinc blende type semiconductor substrate of InP, GaN, GaP, InSb or the like.

According to the embodiment, the base electrode of HBT having the emitter/base junction region the planar shape of which is the ring-like shape is present only on the inner side of the ring-like emitter/base junction region and therefore, the base electrode is limited only to the through hole region and an effect of enabling to realize r<2.5 easily is achieved.

Embodiment 2

An explanation will below be given of an emitter top HBT which is a second embodiment of the invention in reference to FIG. 1, FIG. 2, FIG. 4, FIG. 5 and FIG. 6.

Figure 2:
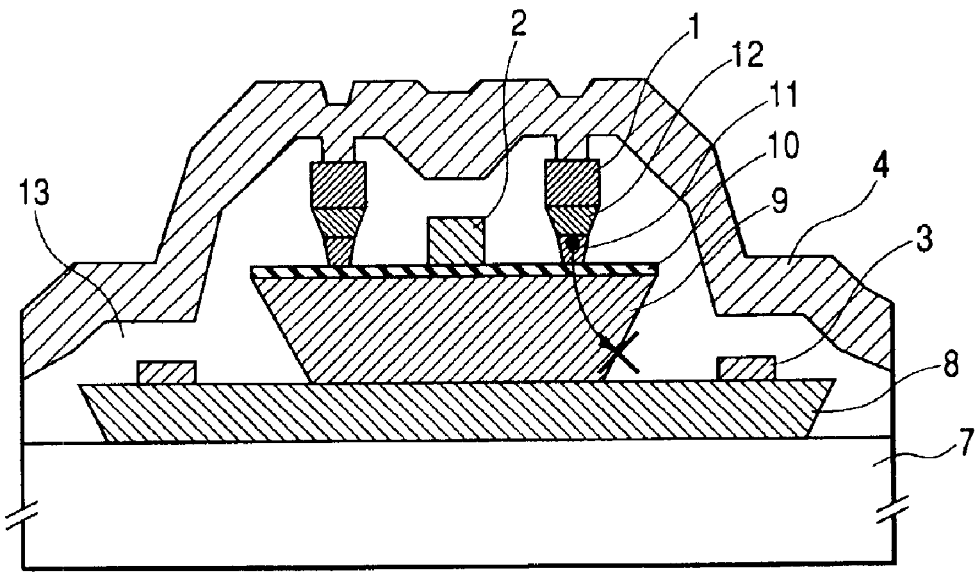
FIG. 2 is a vertical sectional structure view of the emitter top HBT used in the semiconductor device which is the first embodiment of the invention (a face taken along line A–A' of FIG. 1)
Figure 3:
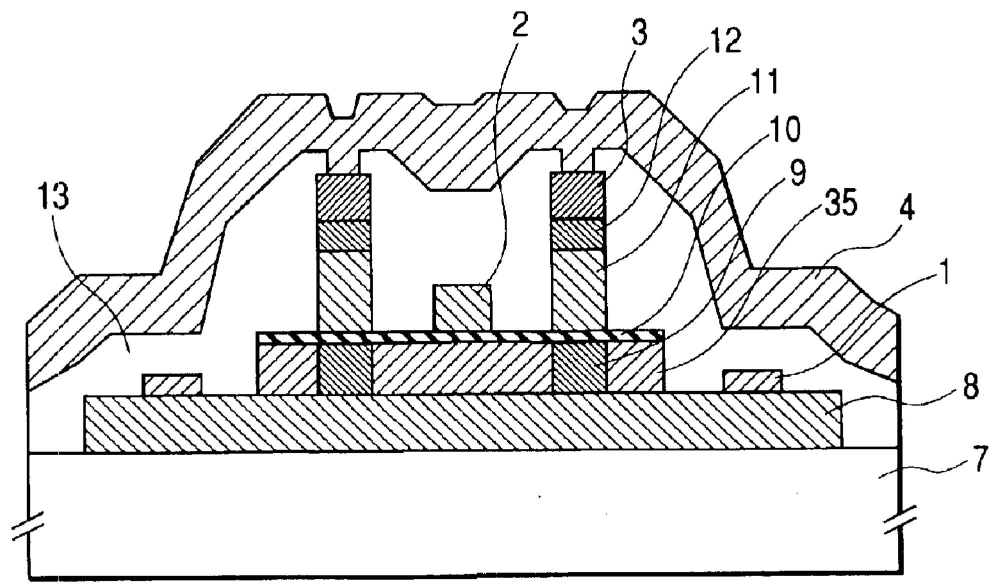
FIG. 3 is a vertical sectional structure view of a collector top HBT which is a prior art.
Figure 4:
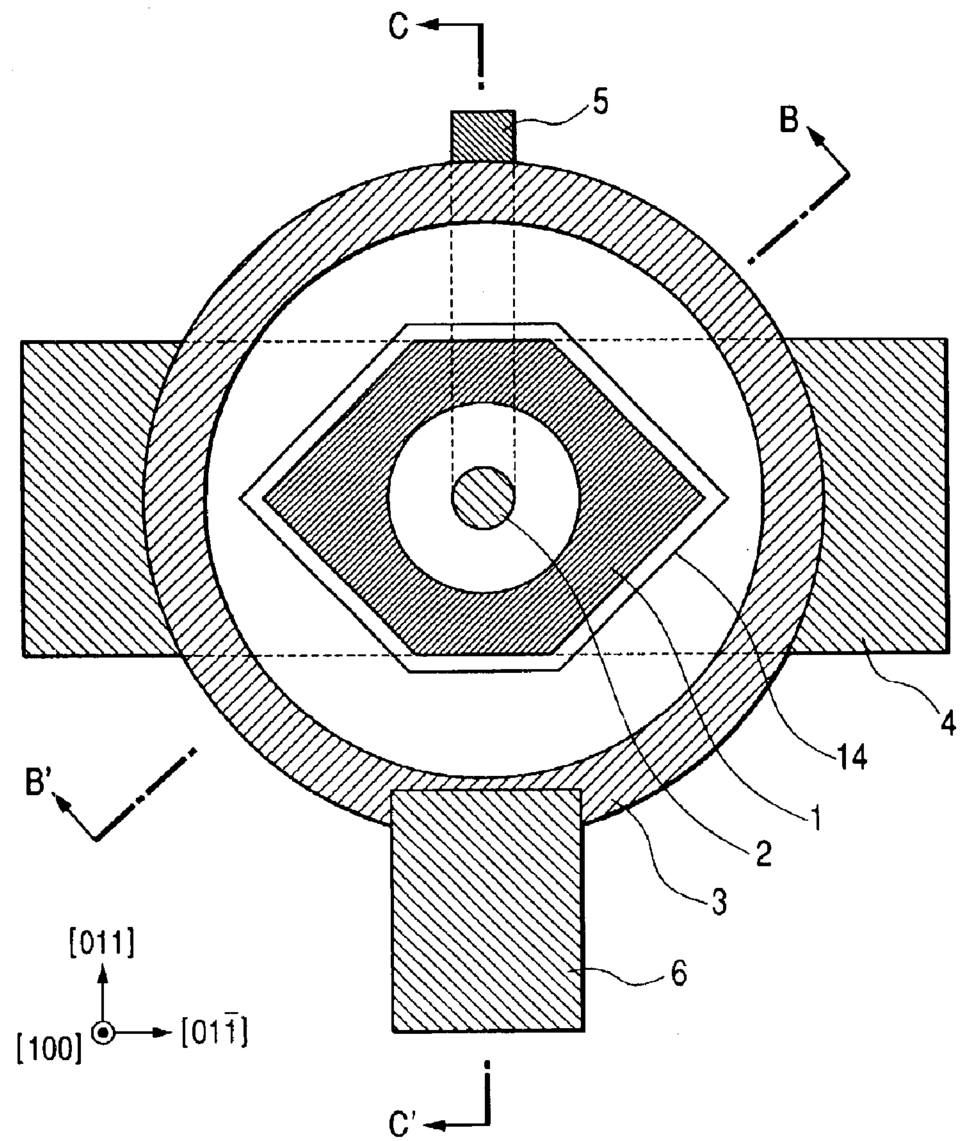
FIG. 4 is a plan structure view of an emitter top HBT used in a semiconductor device which is a second embodiment of the invention.
Figure 6:
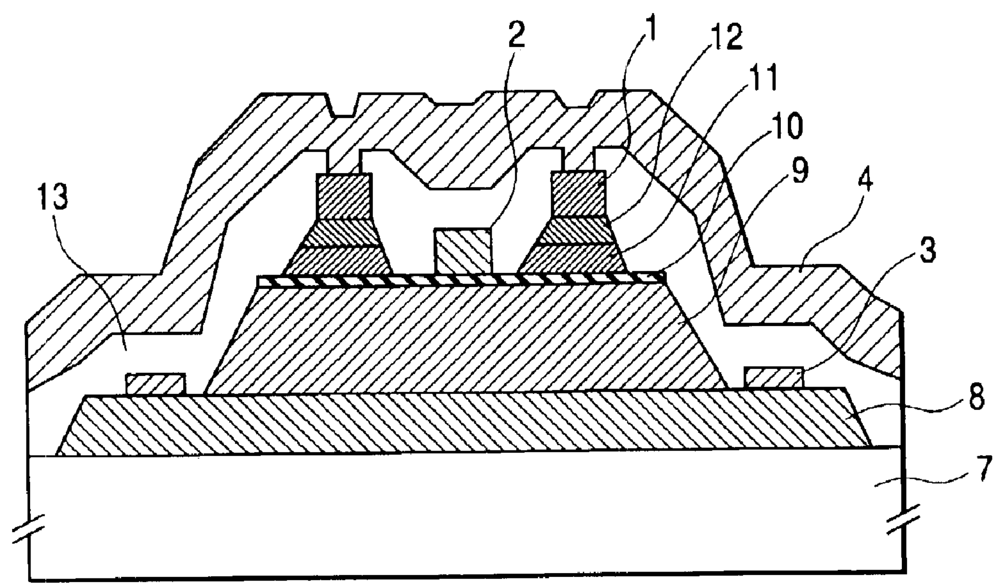
FIG. 6 is a vertical sectional structure view of the emitter top HBT used in the semiconductor device which is the second embodiment (a face taken along line C–C' of FIG. 4) of the invention.

FIG. 4 is a plan structure view of the emitter top HBT which is the second embodiment of the invention. When in the ring-like emitter HBT shown in Embodiment 1 (FIG. 1), the match allowance between the base mesa outer periphery 14 and the emitter electrode 1 is reduced to 0.5 $\mu$m to realize r<2.0, at a face taken along line A–A' of FIG. 1, as shown by FIG. 2, an inverse mesa shape appears at the base mesa outer periphery 14. Since the match allowance between the base mesa outer periphery 14 and the emitter electrode 1 is small, the GaAs surface having a high recombination rate is present within a distance of diffusing electrons at the inside of the collector and the current gain is deteriorated. Hence, as shown by FIG. 4, a side in parallel with [011] direction in which the inverse mesa shape appears is prevented from being present on the outer periphery of the emitter electrode 1 and the base mesa outer periphery 14. Thus, a vertical mesa shape shown in FIG. 5 is constituted at a face taken along line B–B' of FIG. 4, a regular mesa shape shown in FIG. 6 is constituted at a face taken along line C–C' of FIG. 4 and the problem of surface recombination of electrons shown in FIG. 2 is not brought about.

According to a method of fabricating HBT shown in FIG. 4, only dry etching of Embodiment 1 is changed to wet etching, specifically, phosphoric acid: hydrogen peroxide water: water=1:2:40 is used for wet etching of a layer including As and hydrochloric acid is used for wet etching of a layer including P.

Although the explanation has been given of HBT fabricated above GaAs substrate, the embodiment is applicable to all of HBT formed above a zinc blende type semiconductor substrate of InP, GaN, GaP, InSb or the like.

According to the embodiment, there is achieved an effect of enabling to easily realize r<2.0 without dry etching damage or a deterioration in the current gain caused by the inverse mesa shape.

Embodiment 3

An explanation will below be given of an emitter top HBT which is a third embodiment of the invention in reference to FIG. 7.

Figure 7:
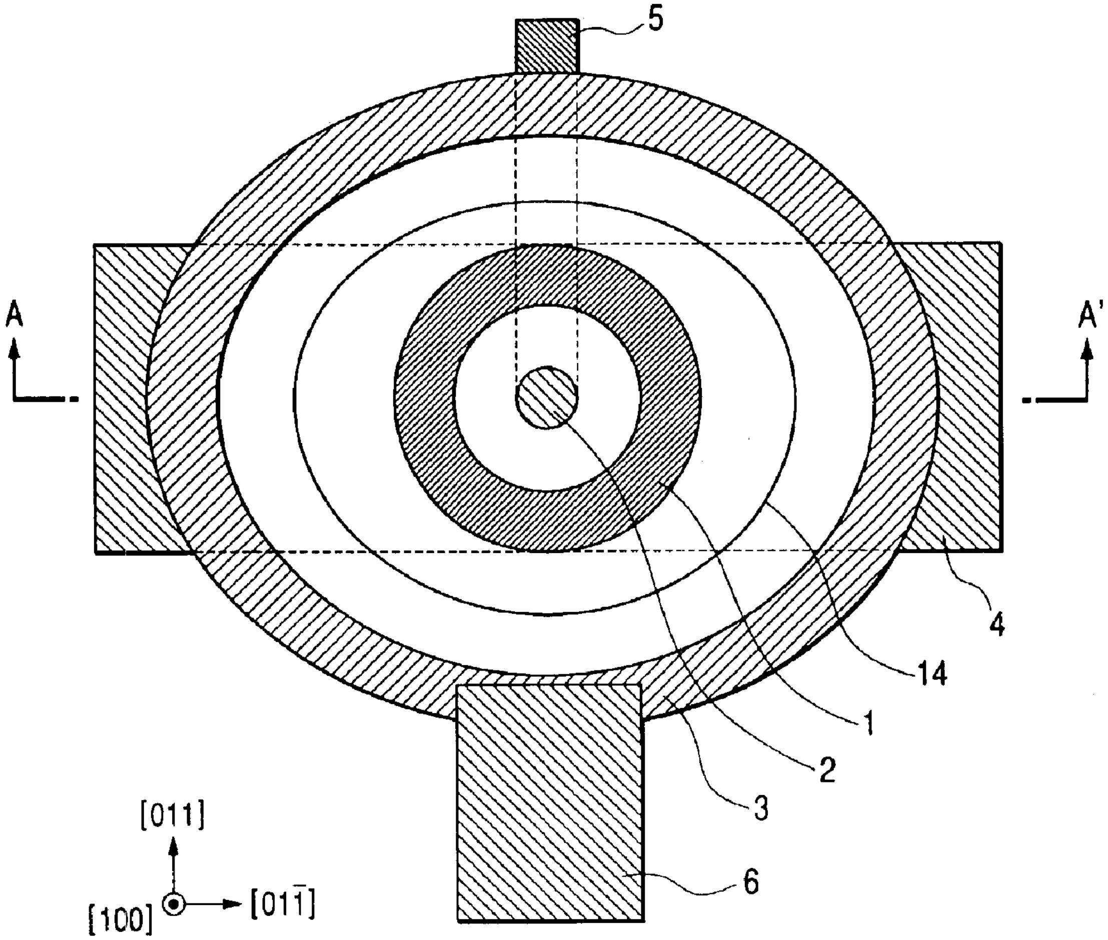
FIG. 7 is a plan structure view of an emitter top HBT used in a semiconductor device which is a third embodiment of the invention.

FIG. 7 is a plan structure view of the emitter top HBT which is the third embodiment of the invention. Although a side in parallel with [011] direction is present, a minimum value of a distance between an outer periphery of a base/collector junction region and an outer periphery of an emitter/base junction region of HBT in [01-1] direction becomes larger than a minimum value of the distance in [011] direction. Specifically, match allowance between the base mesa outer periphery 14 and the emitter electrode 1 is set to 0.5 $\mu$m in [011] direction and 1.5 $\mu$m in [01-1] direction. Further, wet etching is used in fabricating HBT similar to Embodiment 2.

According to the invention, in a semiconductor device using an emitter top type HBT formed above a zinc blende type semiconductor substrate having a (100) (±5 degrees) face at a surface thereof and having an emitter/base junction region the planar shape of which is a ring-like shape, a minimum value of a distance between an outer periphery of a base/collector junction region and an outer periphery of an emitter/base junction region of the HBT in [01-1] direction is made to be larger than a minimum value of the distance in [011] direction, as a result, an effect of enabling to easily realize r<2.0 is achieved.

Figure 9:
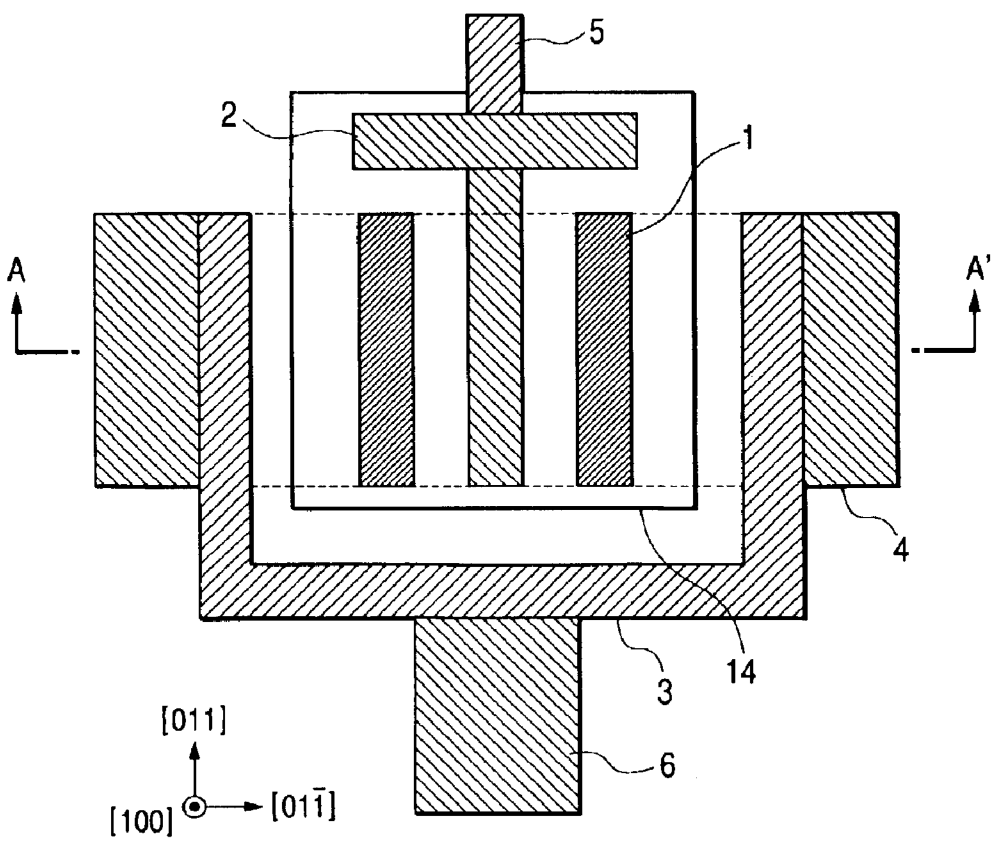
FIG. 9 is a plan structure view of the emitter top HBT used in the semiconductor device which is the third embodiment of the invention.
Figure 10:
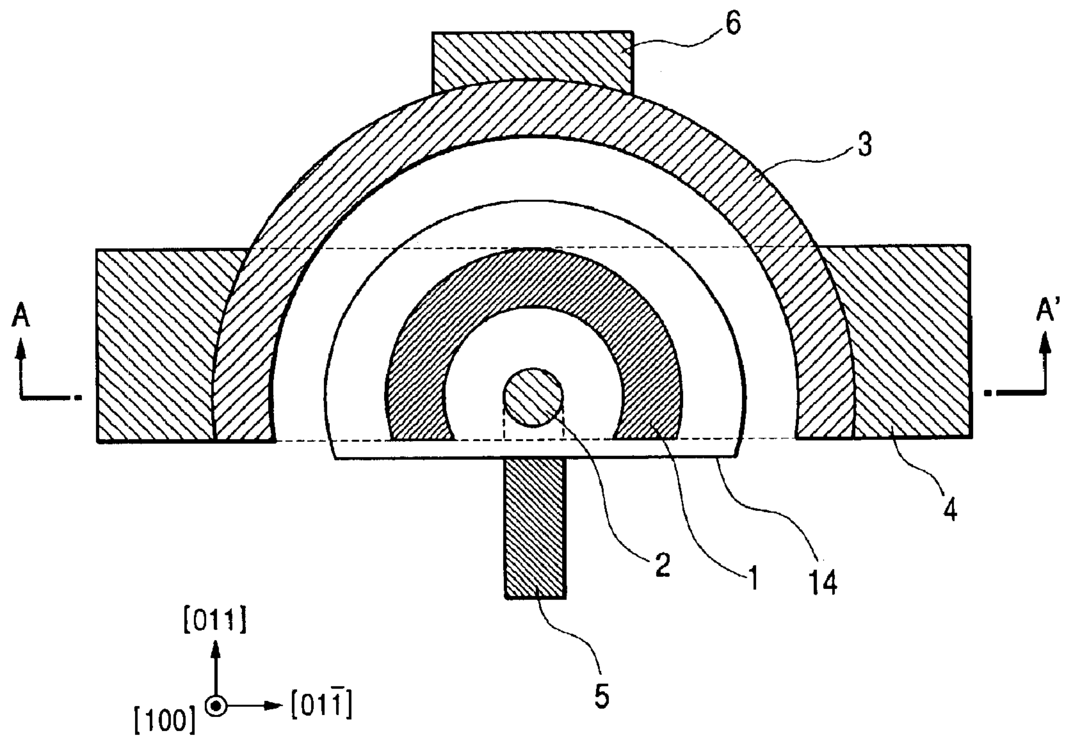
FIG. 10 is a plan structure view of an emitter top HBT used in the semiconductor device which is the third embodiment of the invention.

Also in cases of nonring-like emitters shown in FIGS. 9 and 10, when a minimum value of a distance between an outer periphery of a base/collector junction region and an outer periphery of an emitter/base junction region in [01-1] direction is designed to be larger than a minimum value of the distance in [011] direction, r<2.0 can naturally be realized easily.

Although according to the embodiment, an explanation has been given of HBT fabricated above a GaAs substrate, the embodiment is applicable to all of HBT formed above a zinc blende type semiconductor substrate of InP, GaN, GaP, InSb or the like.

Embodiment 4

An explanation will below be given of HBT satisfying r<1.5 and a method of fabricating the same in reference to FIGS. 14 through 18.

Figure 14:
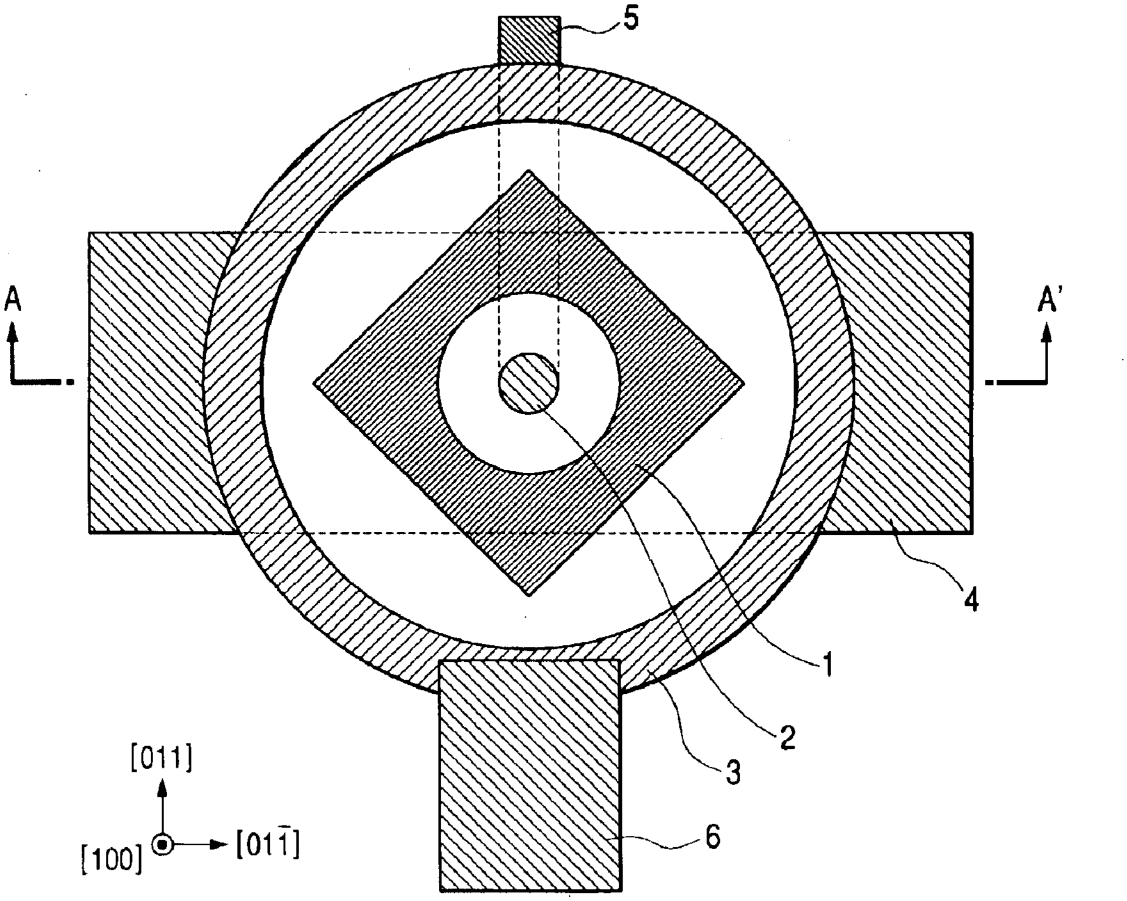
FIG. 14 is a plan structure view of an emitter top HBT used in a semiconductor device which is a fourth embodiment of the invention.

FIG. 14 is a plan structure view of HBT satisfying r<1.5. All of the outer periphery of the emitter electrode 1 is constituted by sides in parallel with {010}, the emitter electrode 1 and the base mesa outer periphery 14 are self-adjustingly formed by an insulating film side wall 15 and a distance thereof is 0.3 $\mu$m. When the width of the emitter electrode is set to 4.5 $\mu$m, r=1.5.

Figure 15:
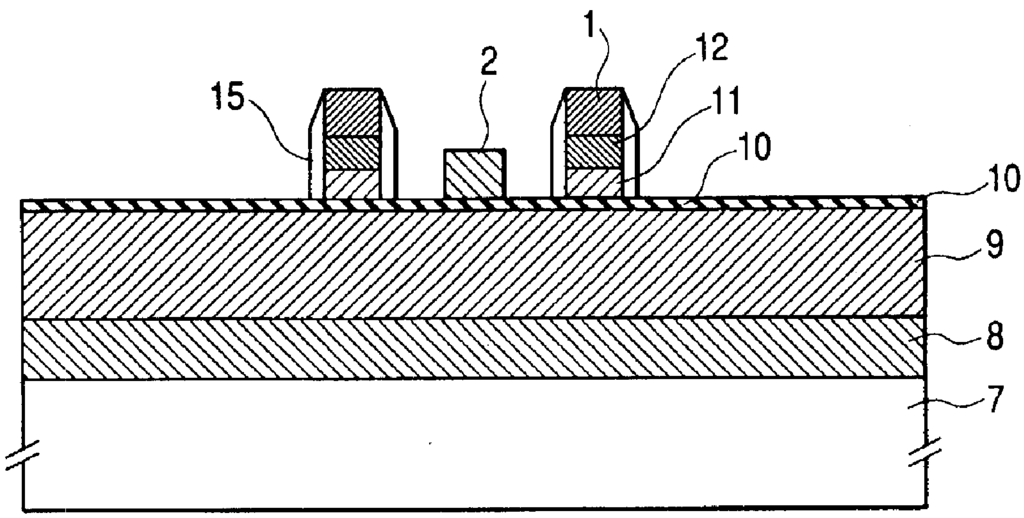
FIG. 15 is an explanatory view of a step of fabricating the emitter top HBT used in the semiconductor device which is the fourth embodiment of the invention.

FIGS. 15 through 18 are vertical sectional structure views for explaining a method of fabricating HBT shown in FIG. 14. The method is similar to that of Embodiment 1 from crystal growth by the metal organic vapor phase epitaxial growth method to exposure of the GaAs base layer 10 and formation of the base electrode 2. Thereafter, an $SiO_2$ film (film thickness 0.5 $\mu$m) is deposited over the entire face by a plasma excited chemical vapor phase deposition method and an $SiO_2$ side wall (film thickness 0.3 $\mu$m) 15 is formed by anisotropic dry etching of $SiO_2$ by using plasma of $C_2F_6$ and $CHF_3$ (FIG. 15).

Figure 16:
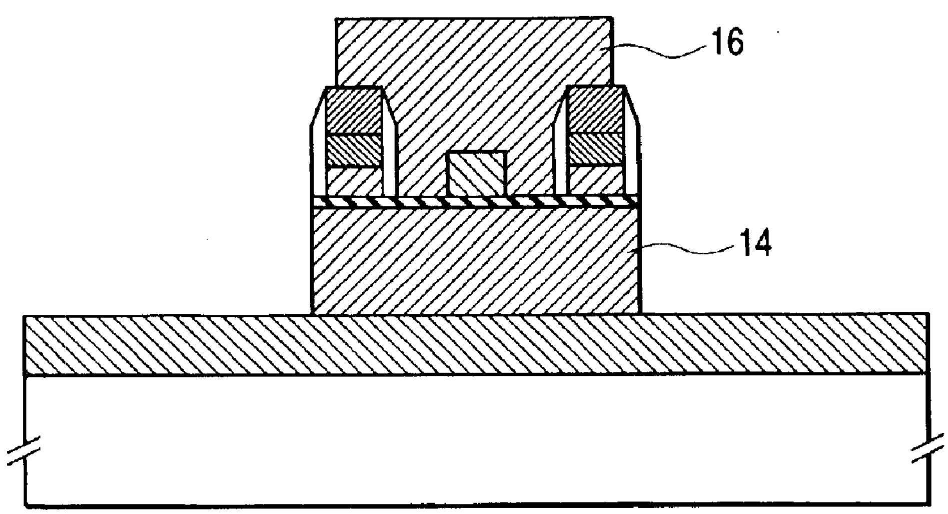
FIG. 16 is an explanatory view of a step of fabricating the emitter top HBT used in the semiconductor device which is the fourth embodiment of the invention.

Further, a photoresist is formed among emitter fingers and with the photoresist and the exposed emitter electrode 1 and the $SiO_2$ side wall 15 as a mask, the base mesa 14 is formed. Although etching is carried out by wet etching, since a base mesa orientation is in parallel with {010}, the mesa shape becomes vertical even when the wet etching is used (FIG. 16).

Figure 17:
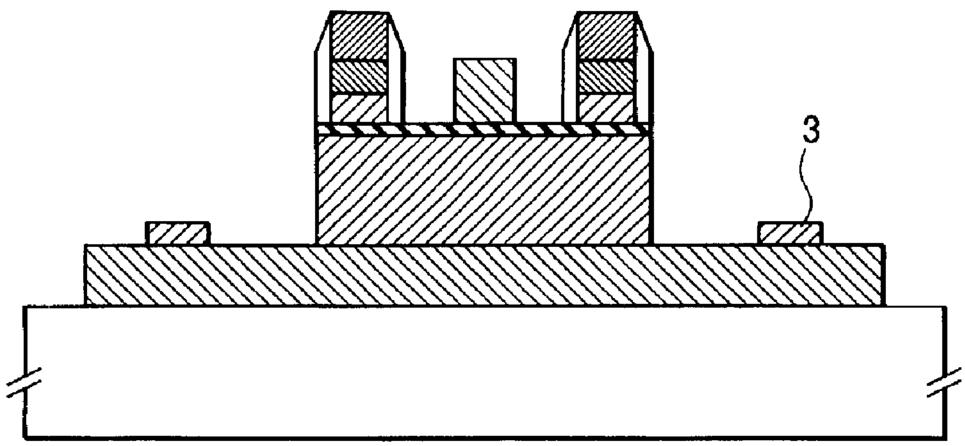
FIG. 17 is an explanatory view of a step of fabricating the emitter top HBT used in the semiconductor device which is the fourth embodiment of the invention.

Thereafter, the photoresist is removed and the AuGe (film thickness 60 nm)/Ni (film thickness 10 nm)/Au (film thickness 200 nm) collector electrode 3 is formed by the lift-off method and alloyed at 350° C. for 30 minutes (FIG. 17).

Figure 18:
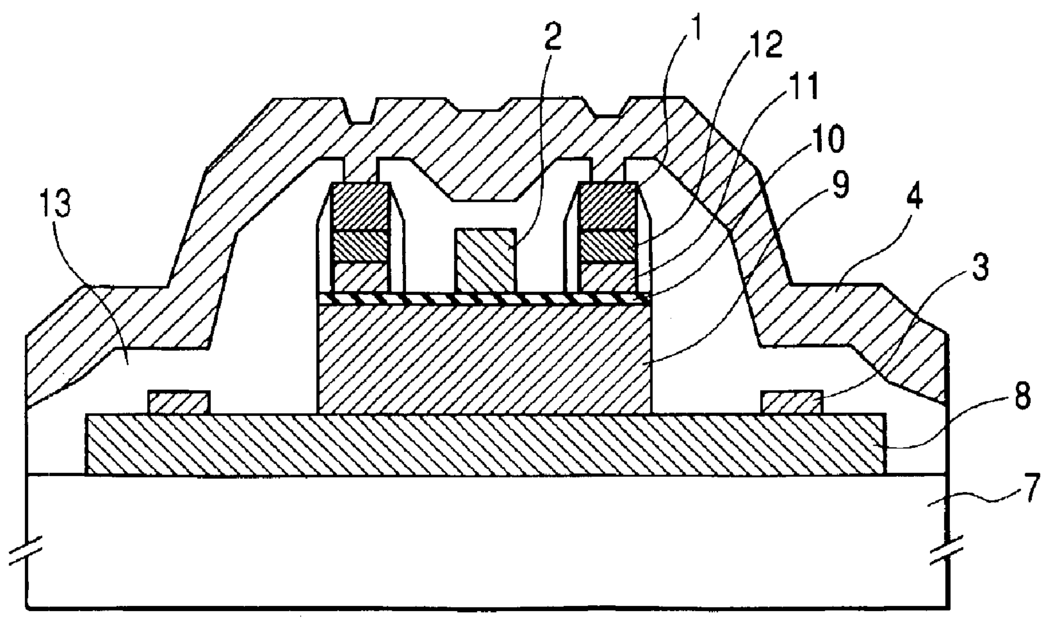
FIG. 18 is an explanatory view of a step of fabricating the emitter top HBT used in the semiconductor device which is the fourth embodiment of the invention.

Further, wiring is carried out by using deposition of metal, photolithography and milling and the emitter top HBT having a vertical sectional structure shown in FIG. 18 is fabricated.

Although according to the embodiment, an explanation has been given of HBT fabricated above the GaAs substrate, the embodiment is applicable to all of HBT formed above a zinc blende type semiconductor substrate of InP, GaN, GaP, InSb or the like.

According to the embodiment as a result of making the distance between the base mesa outer periphery 14 and the emitter electrode 1 proximate to about 0.3 $\mu$m, an effect of enabling to easily realize r<1.5 is achieved.

Embodiment 5

An explanation will below be given of a semiconductor device which is a fifth embodiment of the invention and a power amplifier module using the semiconductor device in reference to FIGS. 19 through 21.

Figure 19:
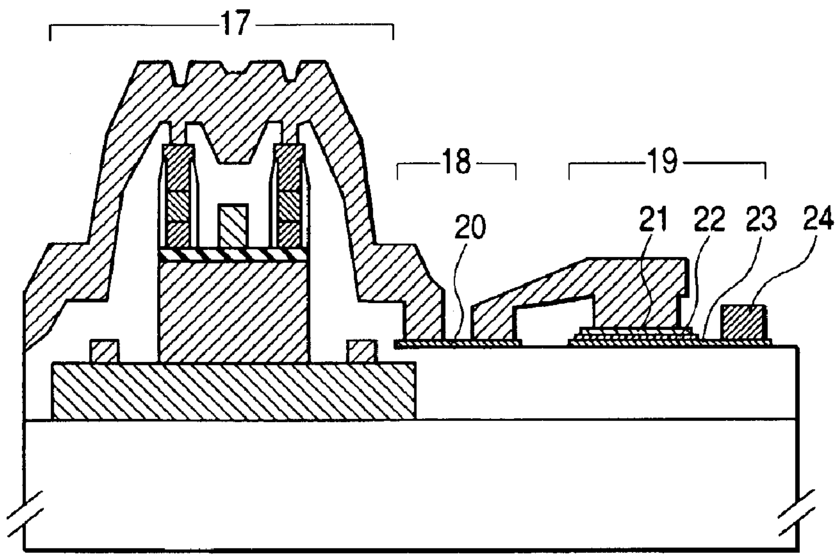
FIG. 19 is a vertical sectional structure view showing integrated formation of an emitter top HBT, a capacitor element and a resistor element in MMIC for a power amplifier module which is a fifth embodiment of the invention.
Figure 20:
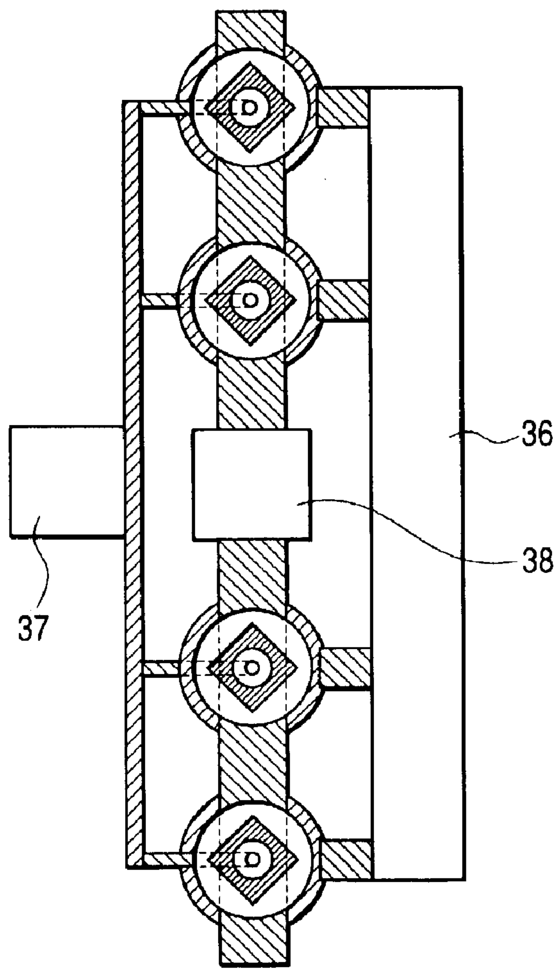
FIG. 20 is a plan structure view of a multifinger HBT used in MMIC for a power amplifier module which is the fifth embodiment of the invention.

FIG. 19 is a vertical sectional structure view of MMIC (monolithic microwave integrated circuit) in which HBT 17 satisfying r<1.5 is integrated with a resistor element 18 and a capacitor element 19. The resistor element 18 comprises a resistor WSiNl layer and the capacitor element 19 comprises three layers of an $SiO_2$ film 22, an $Si_3N_4$ film 23 and an $SiO_2$ film 24. Further, numeral 24 designates a wiring first layer connected from a lower electrode of the capacitor element.

MMIC includes any one kind of a passive element including an inductance element, a pn junction diode, and a schottkey barrier diode in addition to the resistor element and the capacitor element above the substrate on which HBT 17 is mounted. HBT 17 may be a multifinger HBT constituted by connecting in parallel a plurality of pieces of HBTs and FIG. 20 shows an example of a plan structure of the multifinger HBT connected in parallel with four HBTs. In this case, a ballast resistor may sometimes be added to an emitter or a base of each HBT to avoid nonuniform operation among respective HBTs.

Figure 21:
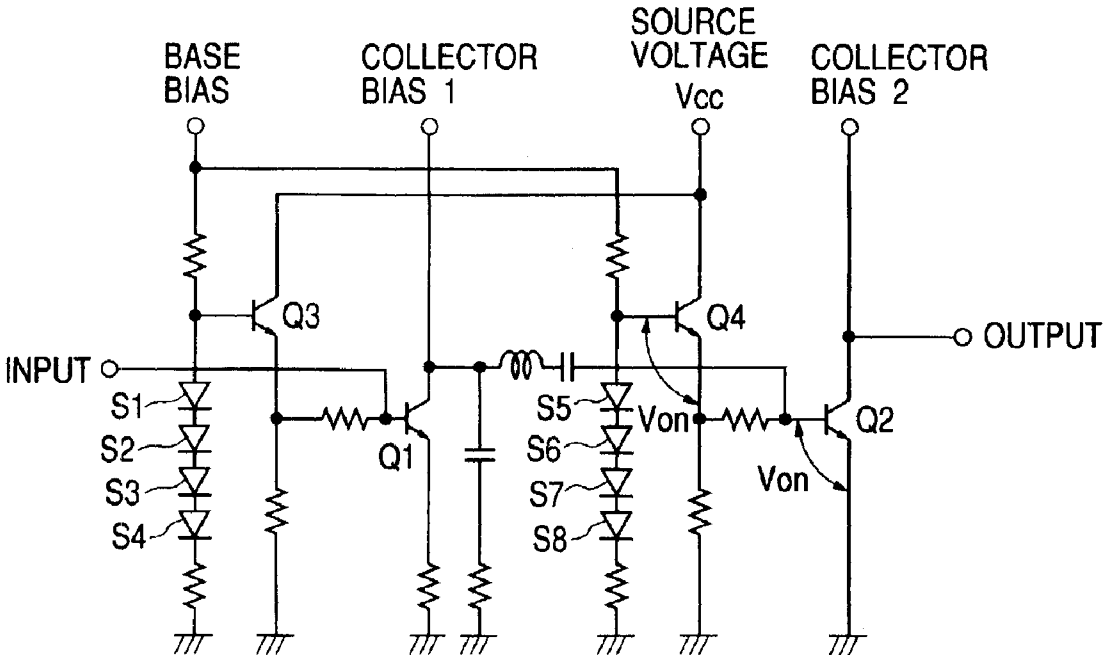
FIG. 21 is a circuit diagram of MMIC for a power amplifier comprising two stages of HBT and a bias circuit.
Figure 22:
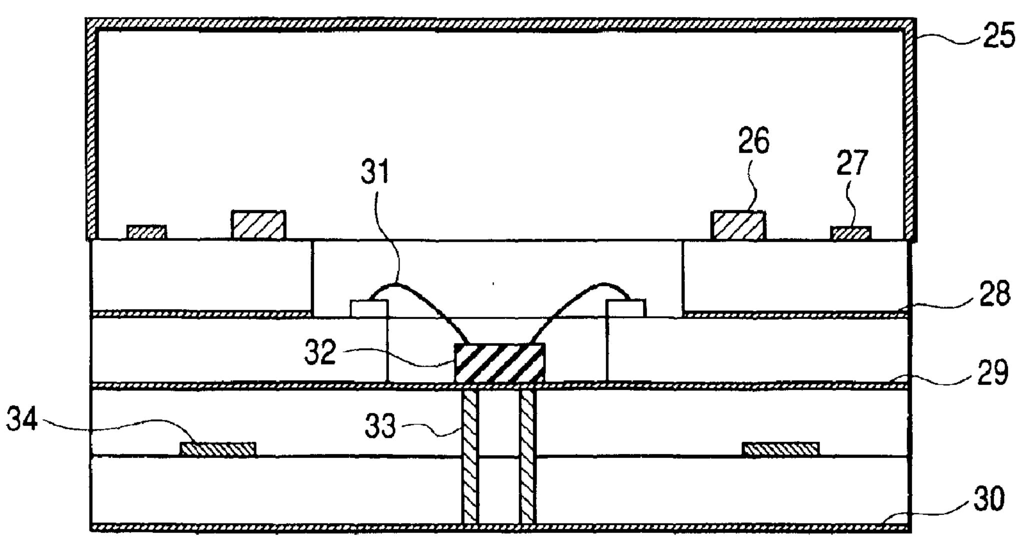
FIG. 22 is a vertical sectional structure view of the power amplifier module which is the fifth embodiment of the invention.

FIG. 21 is a circuit diagram of MMIC fabricated as a semiconductor device. The MMIC is used in the inside of a power amplifier module 32 shown in FIG. 22. A glass ceramics substrate sintered at low temperature having a specific inductive capacity of 8 is used in a package of FIG. 22. Numeral 25 designates a metal cap and numeral 26 designates a chip part. Numeral 27 designates a transmission line in which a laminated film of Ag and Pt is formed by thick film screen printing. A rear face of the MMIC chip 32 is electrically connected to a ground layer 29 by Ag paste. An input/output electrode pad arranged at a surface of the MMIC chip 32 is drawn to the outside of the chip by wire bonding 31. Numeral 33 designates a thermal via and numerals 28 and 30 designate the same ground layers as the ground layer 29. As a result of evaluating a characteristic of the power amplifier by using a wide-band code division multiple access system (W-CDMA) signal, significant promotion of the characteristic of a power adding efficiency of 45% and a power gain of 28 dB is confirmed in comparison with a power adding efficiency of 40% and a power gain of 25 dB when the emitter top HBT of the prior art is used.

According to the embodiment, an effect of enabling to fabricate the power amplifier having the high power adding efficiency and the high power gain is achieved by using the semiconductor device having as low as a ratio of r<1.5.

According to the invention, there is achieved an effect of enabling to realize the semiconductor device using HBT suitable for fabricating the power amplifier having the high power adding efficiency and high power gain in which the ratio is as low as r<2.5 through r<1.5.

Next, prior to exemplifying a specific embodiment of the power amplifier module, further specific modes of the invention will be enumerated.

In order to achieve the fifth object of the invention, in the power amplifier according to the invention, in a multistage amplifier comprising a first amplifier circuit connected in parallel with at least one or more of bipolar transistors and a second amplifier circuit connected in parallel with at least one or more of bipolar transistors, a planer shape of the bipolar transistor used in the first amplifier circuit is made in a rectangular emitter shape, a planar shape of the bipolar transistor used in the second amplifier circuit is made in a ring-like emitter shape and a base electrode thereof is present only on the inner side of the ring-like emitter.

Further, in order to achieve the fifth object of the invention, in the power amplifier according to the invention, in a multistage power amplifier comprising a first amplifier circuit connected in parallel with at least one or more of bipolar transistors and a second amplifier circuit connected in parallel with at least one or more of bipolar transistors, a planar shape of the bipolar transistor used in the first amplifier circuit is made in a rectangular emitter shape, a planar shape of the bipolar transistor used in the second amplifier circuit is constituted by an emitter shape which is a portion of a ring-like shape and a base electrode thereof is present only on the inner side of the ring-like emitter.

Further, in order to achieve the fifth object of the invention, in the power amplifier according to the invention, in an amplifier circuit constituted by one or more of bipolar transistors connected in parallel, a planar shape of the bipolar transistor is provided with an emitter shape which is a ring-like shape, a base electrode is present only on an inner side of the ring-like emitter and a base thereof is connected to a resistor having a negative temperature coefficient to cancel a change of base resistance.

Further, in order to achieve the fifth object of the invention, in the power amplifier according to the invention, in an amplifier circuit constituted by one or more of bipolar transistors connected in parallel, a planar shape of the bipolar transistor is provided with an emitter shape which is a portion of a ring-like shape, a base electrode thereof is present only on an inner side of the emitter which is the portion of the ring-like shape and a base thereof is connected to a resistor having a negative temperature coefficient to cancel a change of base resistance.

A detailed description will below be made of a power amplifier showing a mode for carrying out the invention and a method of fabricating the power amplifier in reference to the drawings. Further, in all of the drawings for explaining the mode for carrying out the invention, the same characters denote the same functions and the repeated explanation thereof will be omitted.

Embodiment 6

Figure 23:
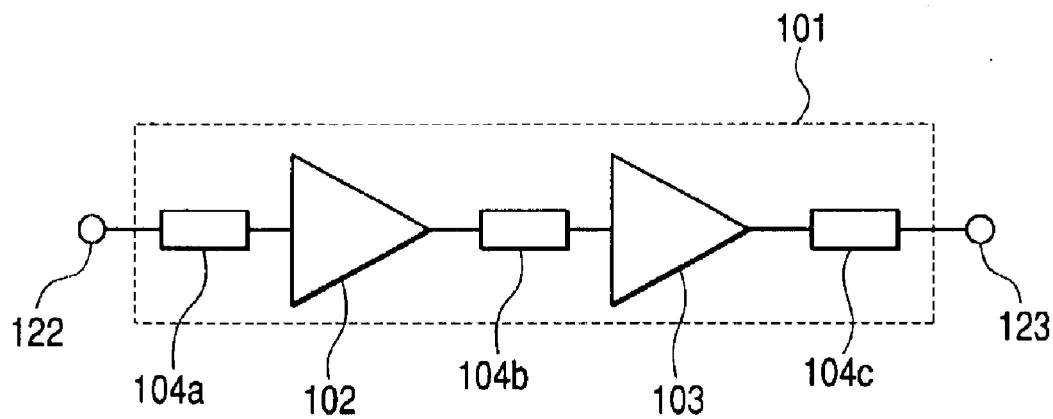
FIG. 23 is a block diagram showing a power amplifier which is an embodiment of the invention.

An explanation will be given of a power amplifier according to Embodiment 6 in reference to the drawings. FIG. 23 is a block diagram of a power amplifier showing the embodiment. The example is a power amplifier constituted by two stages. In the figure, numerals 102 and 103 respectively designate a first amplifier circuit and a second amplifier circuit and numerals **104*a*, 104*b* and 104*c* respectively designate an input matching circuit, an interstage matching circuit and an output matching circuit. A high frequency signal to be amplified is inputted from a terminal 122 to the power amplifier, amplified via the matching circuits 104*a*, 104*b*, 104*c* and the amplifier circuits 102 and 103 and thereafter outputted from a terminal 123**.

Figure 42:
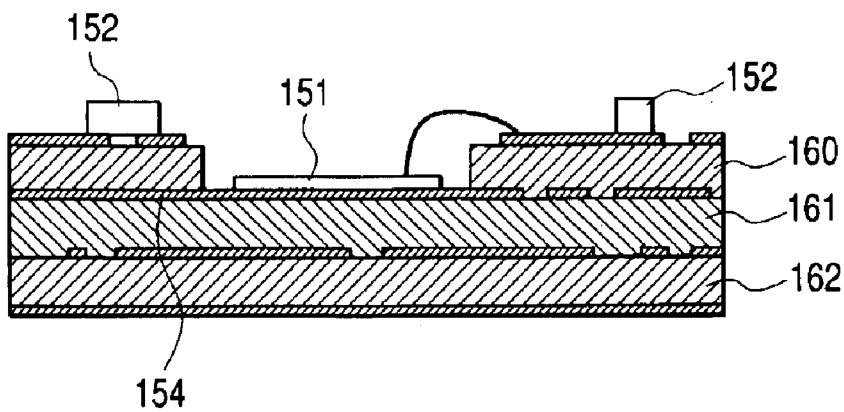
FIG. 42 is a sectional view showing mounting of a representative power amplifier module.
Figure 43:
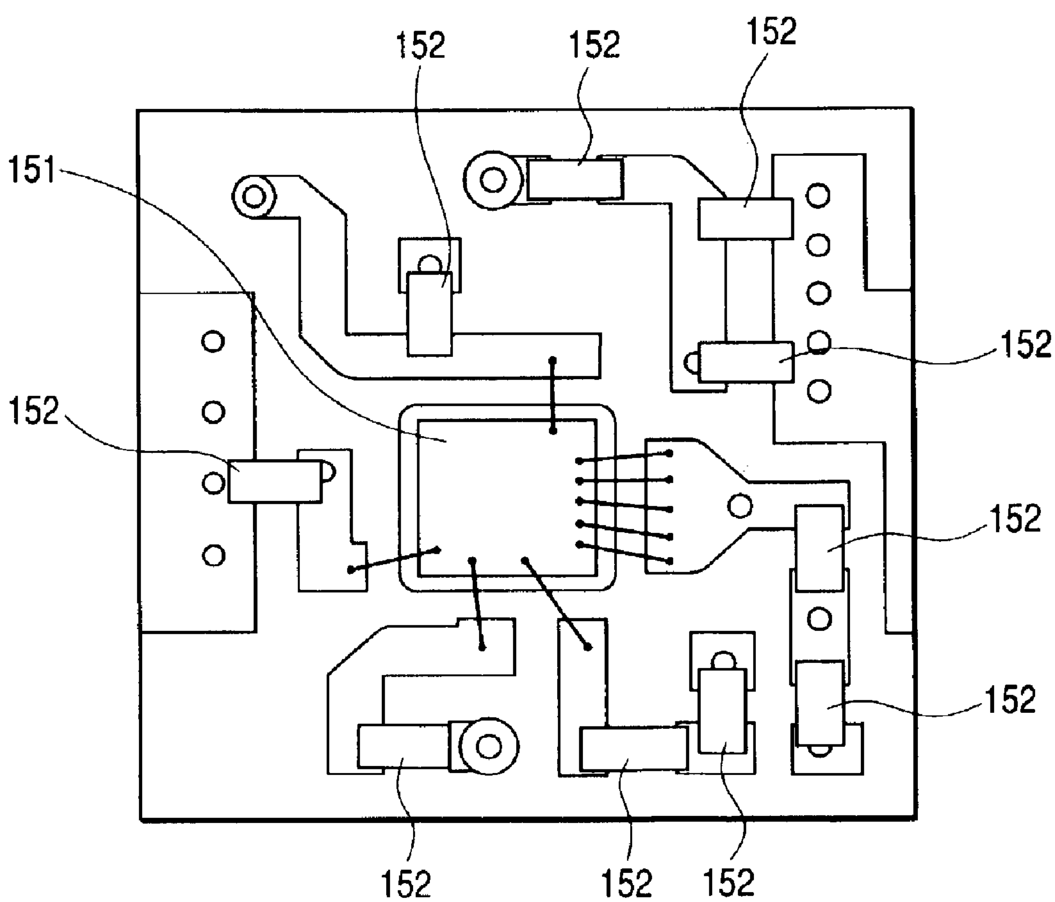
FIG. 43 is a plan view showing mounting of the representative power amplifier module.

FIG. 42 and FIG. 43 are respectively a sectional view and a plan view showing a state of mounting a representative power amplifier module. A mounting board 160 is mounted with a semiconductor element 151 and a passive element 152. Numeral 154 designates a conductive layer constituting connection of an electric signal with the semiconductor element 151. According to the example, a plurality of mounting boards 160, 161 and 162 are stacked to use. Further, the semiconductor element 151 is the above-described power amplifier.

Figure 24:
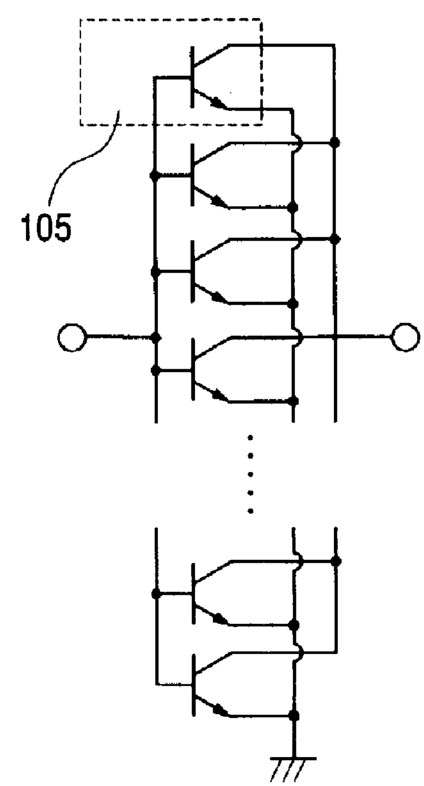
FIG. 24 is a circuit diagram showing an example of a first amplifier circuit of a power amplifier which is an embodiment of the invention.
Figure 25:
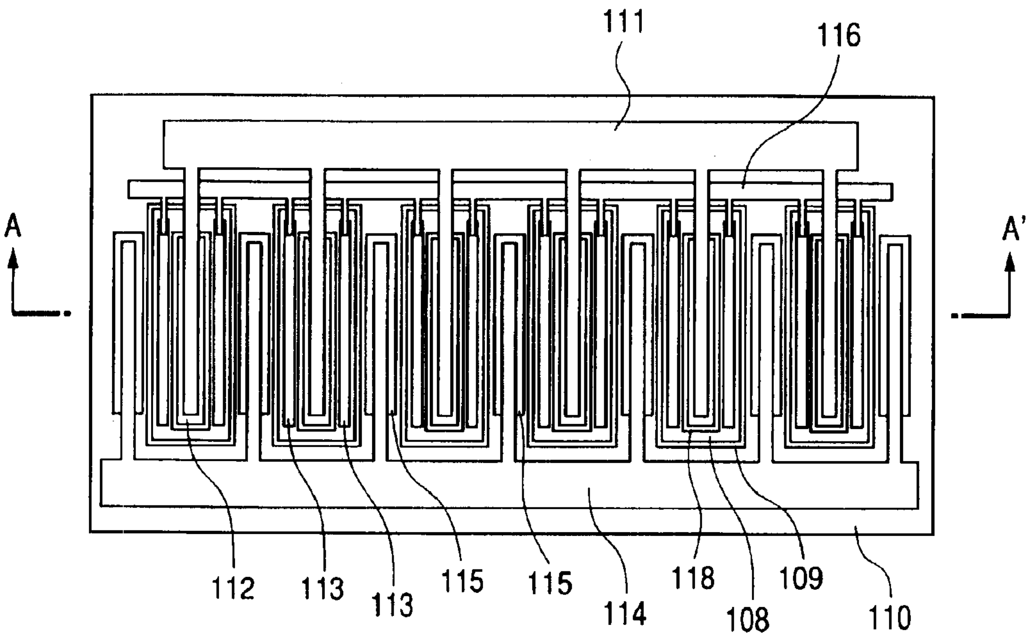
FIG. 25 is a plan view showing an example of the first amplifier circuit of the power amplifier which is an embodiment of the invention.
Figure 26:
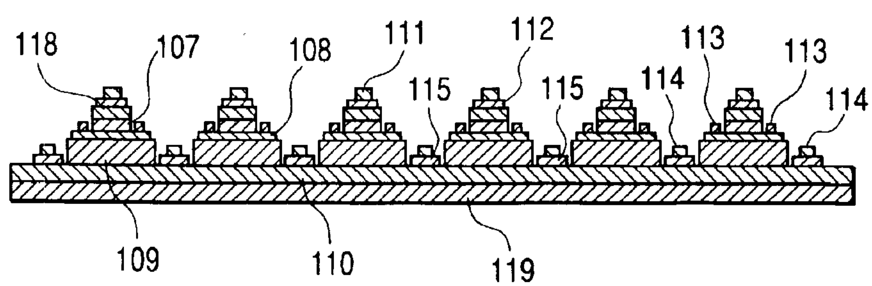
FIG. 26 is a sectional view showing an example of the first amplifier circuit of the power amplifier which is an embodiment of the invention.

FIG. 24 shows a circuit diagram of the first amplifier circuit 102. The first power amplifier circuit 102 is constituted by eight basic HBTs 105 connected in parallel each having an emitter area of 108 $\mu m^2$. FIG. 24 shows a portion of the basic HBT 105 by surrounding the portion by dotted lines. Further, FIG. 25 shows a planar structure of the amplifier circuit 102 and FIG. 26 shows a sectional structure thereof taken along line A–A' in FIG. 25. Here, numerals 118, 107, 108, 109, 110 and 119 respectively designate an emitter contact layer, an InGaP emitter layer, a GaAs base layer, a GaAs collector layer, a GaAs subcollector layer and a GaAs substrate. Further, numerals 112, 113 and 115 respectively designate an emitter electrode, a base electrode and a collector electrode. Further, numerals 111, 116 and 114 respectively designate emitter wiring, base wiring and collector wiring for connecting respective basic HBTs.

Figure 27:
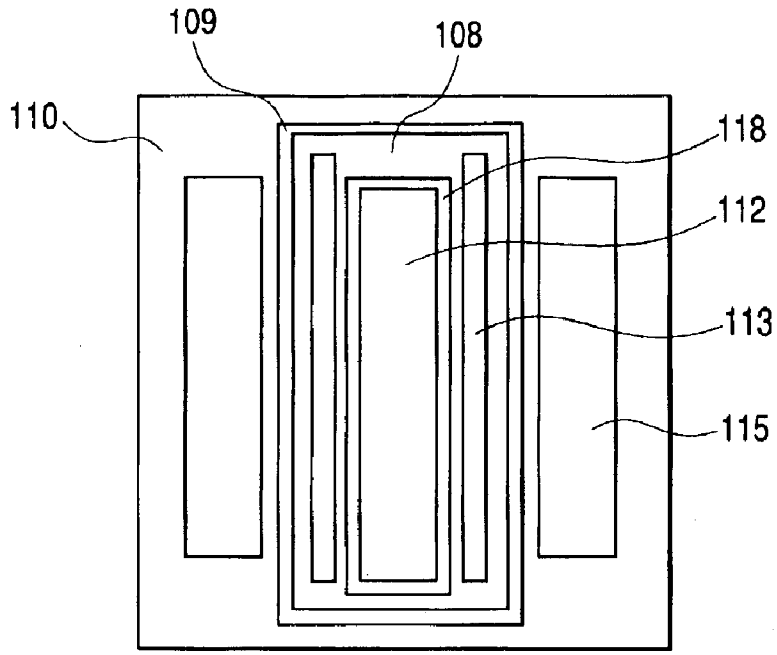
FIG. 27 is a plan view showing an example of basic HBT used in the first amplifier circuit of the power amplifier which is an embodiment of the invention.

FIG. 27 shows a detailed plan view of a basic HBT. The example shows HBT having a rectangular emitter shape.

Respective portions are mounted above the GaAs subcollector 110 formed above the semiinsulating GaAs substrate. Numeral 109 designates a collector region, planarly, at a center thereof, the rectangular emitter electrode 112 is formed above the emitter contact layer 118. As shown by the sectional view of FIG. 26, the emitter layer 107 is formed below the emitter contact layer 118. Rectangular regions on both sides of the emitter electrode 112 are the base electrodes 113 and the base region is designated by numeral 108. Rectangular regions present on both sides of the collector region 109 are the collector electrodes 115.

Figure 8:
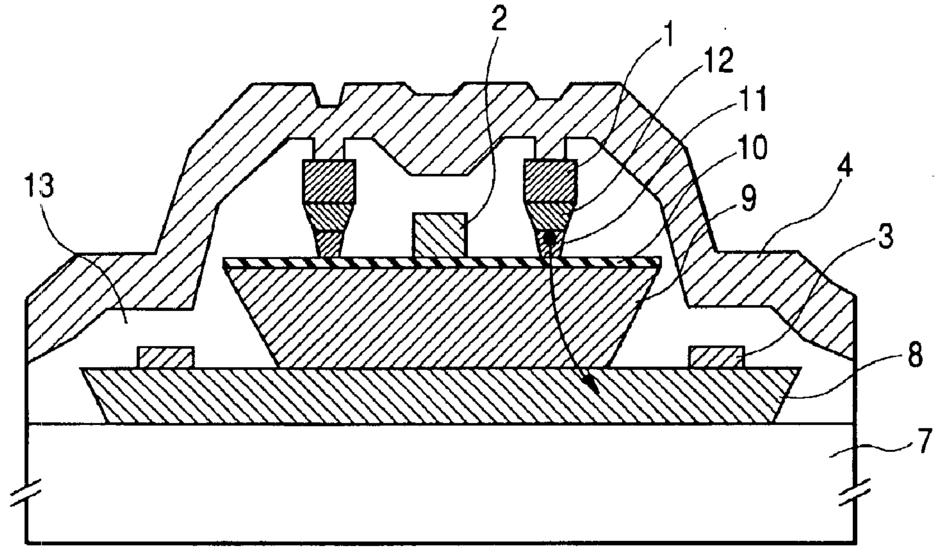
FIG. 8 is a vertical sectional structure view (a face taken along line A–A' of FIG. 7) of the emitter top HBT used in the semiconductor device which is the third embodiment of the invention.
Figure 28:
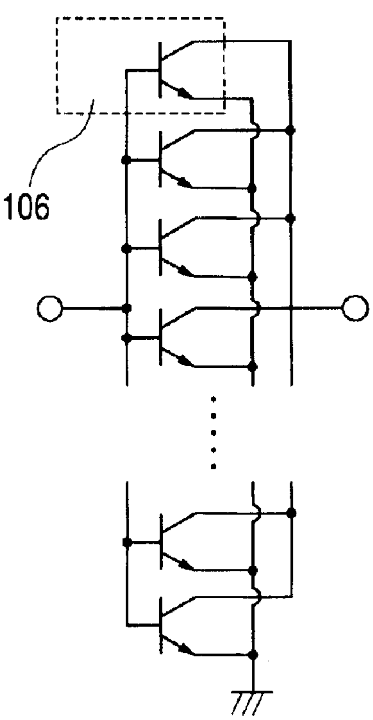
FIG. 28 is a circuit diagram showing an example of a second amplifier circuit of a power amplifier which is an embodiment of the invention.
Figure 29:
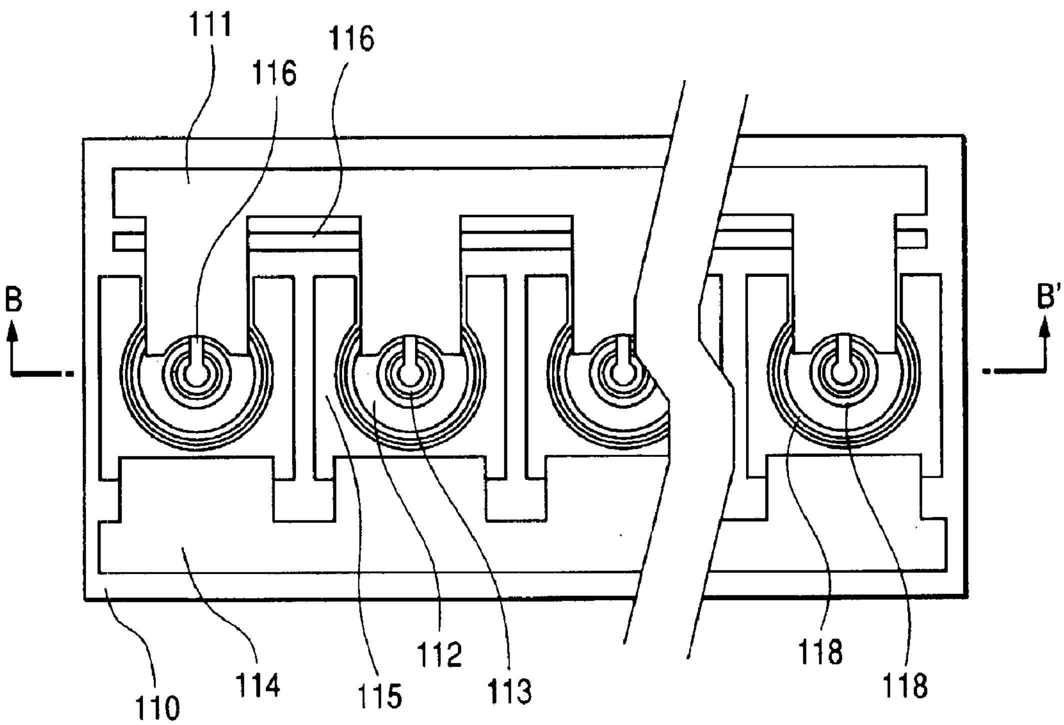
FIG. 29 is a plan view showing an example of the second amplifier circuit of the power amplifier which is an embodiment of the invention.

FIG. 28 shows a circuit diagram of the second amplifier circuit 103. The example is constituted by 28 basic HBTs 106 connected in parallel each having a emitter area of 132 $\mu m^2$. FIG. 28 shows a portion of the basic HBT 106 by dotted lines. FIG. 29 shows a plan structure of the amplifier circuit 103 and FIG. 8 shows a sectional structure thereof taken along line B–B' of FIG. 29. Here, numerals 118, 107, 108, 109, 110 and 119 respectively designate an emitter contact layer, an InGaP emitter layer, a GaAs base layer, a GaAs collector layer, a GaAs subcollector layer and a GaAs substrate. Further, numerals 112, 113, 115 respectively designate an emitter electrode, a base electrode and collector electrode. Further, numerals 111, 116 and 114 respectively designate emitter wiring, base wiring and collector wiring for connecting respective basic HBT.

Figure 30:
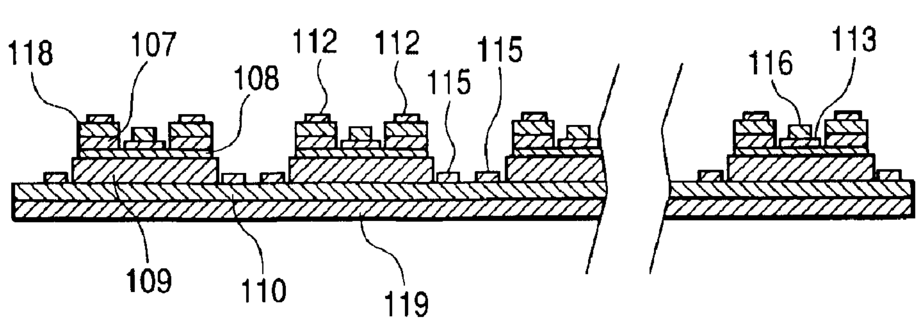
FIG. 30 is a sectional view of a device showing an example of the second amplifier circuit of the power amplifier which is an embodiment of the invention.
Figure 31:
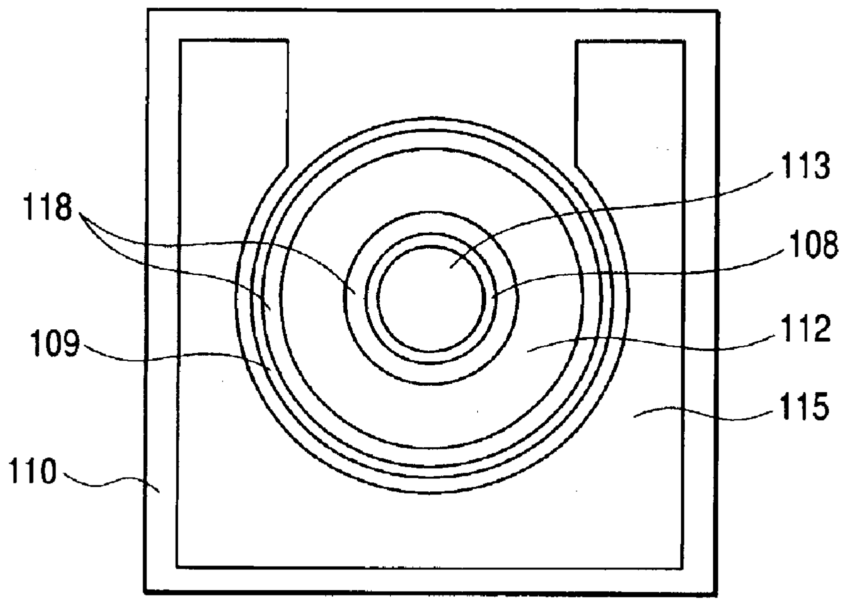
FIG. 31 is a plan view showing an example of basic HBT used in the second amplifier circuit of the power amplifier which is an embodiment of the invention.

FIG. 31 shows a detailed plan view of a basic HBT. Unlike the example shown in FIG. 25, according to the example of the basic HBT, the emitter shape is a ring-like shape. Further, the example shows HBT in which the base electrode is present only on the inner side of the ring-like emitter. Respective portions are mounted above the GaAs subcollector 110 formed above the GaAs substrate. Numeral 109 designates a collector region in a circular shape, planarly, at a center thereof, the emitter electrode 112 in the ring-like shape is formed or the emitter contact layer 118. As shown by the sectional view of FIG. 30, the emitter layer 7 is formed below the emitter contact layer 118. The base electrode 113 is arranged on the inner side of the emitter electrode 112 in the ring-like shape. Numeral 8 designates the base region. A region present by surrounding the most portion of the collector region 109 is the collector electrode 115.

Figure 32:
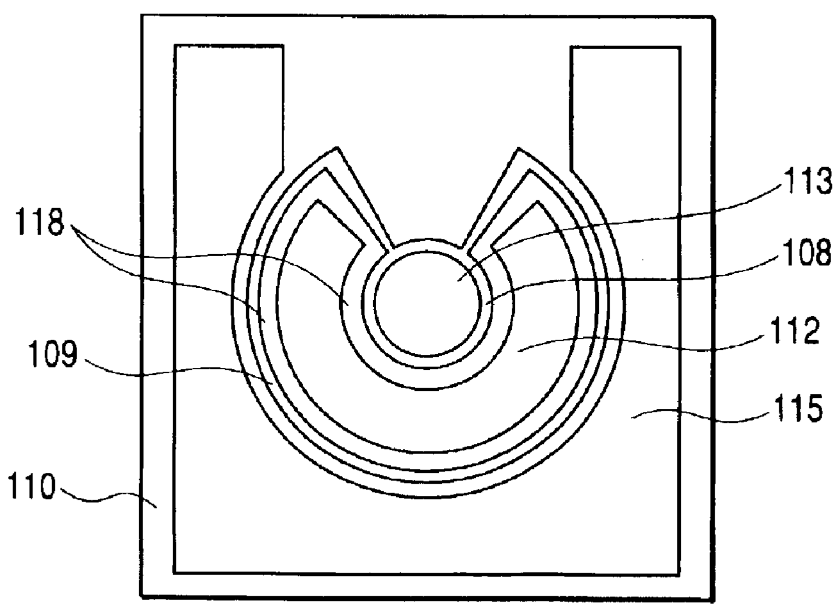
FIG. 32 is a plan view showing an example of basic HBT used in the second amplifier circuit of the power amplifier which is an embodiment of the invention.

Further, although in the power amplifier of the embodiment, the basic HBT used in the second amplifier circuit, as shown by FIG. 31, is representatively shown by the ring-like emitter HBT in the circular shape, the basic HBT may be HBT which is provided with the emitter shape which is a shape of a portion of a ring-like region shown in FIG. 32 and in which the base electrode is present only on the inner side of an emitter which is a portion of a shape of the ring-like shape.

Figure 33:
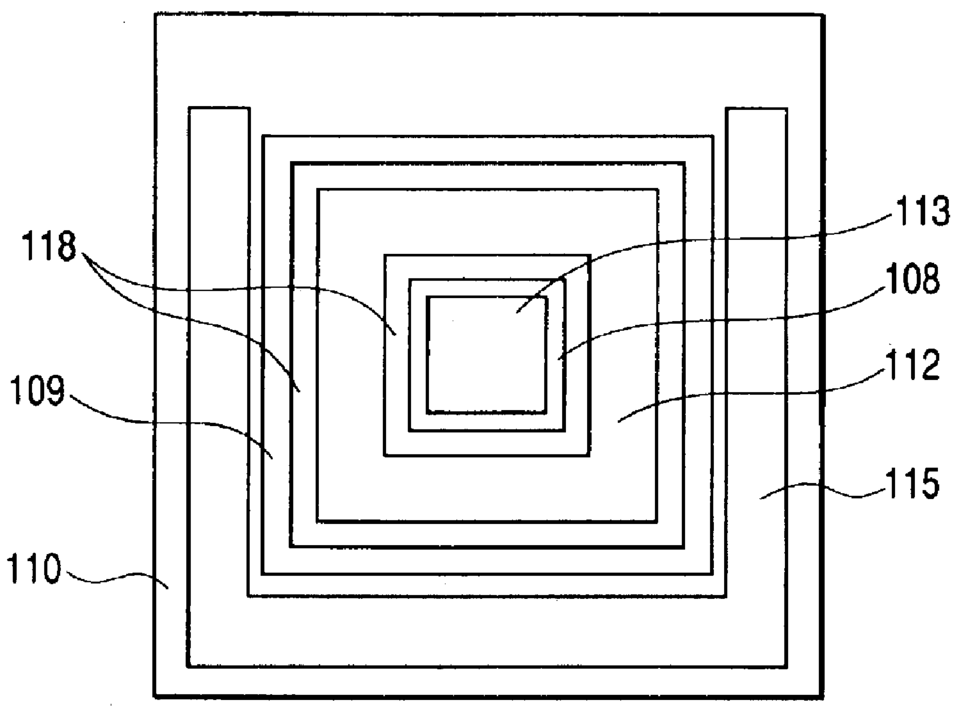
FIG. 33 is a plan view showing an example of basic HBT used in the second amplifier circuit of the power amplifier which is an embodiment of the invention.

Further, the basic HBT may be HBT having an emitter shape in a polygonal shape shown in FIG. 33. Although the example of FIG. 33 specifically shows a quadrangular shape, other polygonal shapes can be used. Arrangement of respective portions of HBT is similar to that of the example of FIG. 31 and therefore, a detailed explanation thereof will be omitted.

That is, according to the basic HBT used in the second amplifier circuit, the shape of the emitter is a ring-like shape or a shape of a portion of a ring-like shape or a polygonal shape or the like and the base electrode may be present only on the inner side of the emitter region.

Figure 34:
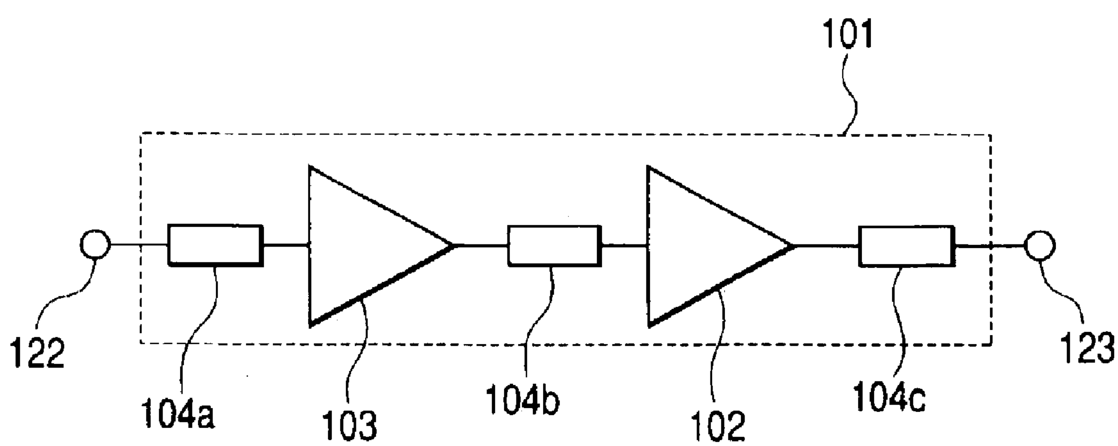
FIG. 34 is a block diagram showing an example of a power amplifier which is an embodiment of the invention.

Further, although according to the power amplifier of the embodiment, there is shown a case in which the first amplifier circuit 102 constitutes a driver stage and the second amplifier circuit 103 constitutes an output stage, the same effect is achieved by constituting the output stage by the first amplifier circuit 102 and constituting the driver stage by the second amplifier circuit 3 as shown by FIG. 34. However, in this case, it is necessary to adjust the number of the basic HBTs arranged in parallel, which is used in each of the amplifier circuits.

Further, although the InGaP emitter HBT is shown as an example of the bipolar transistor used in the power amplifier of the embodiment, according to the invention, a wide range of HBTs of an AlGaAs emitter HBT, an InP emitter HBT using an InP substrate, an InGaAlAs emitter HBT and the like can be used other than the example.

Further, the amplifier circuit 2 and the amplifier circuit 3 may be formed on the same semiconductor substrate, further, the matching circuits 104*a*, 104*b* and 104*c* may also be formed on a substrate formed with the amplifier circuit 102 and the amplifier circuit 103.

Embodiment 7

An explanation will be given of a method of fabricating a power amplifier by using the embodiment in reference to the drawings.

FIGS. 35A through 35H are sectional views of a device showing a method of fabricating a power amplifier in accordance with fabricating steps. The embodiment shows a power amplifier constituted by two stages. In the figures, numerals 124 and 125 respectively designate a portion of forming a first amplifier circuit and a portion of forming second amplifier circuit. An explanation will be mainly given of a basic HBT below. According to the embodiment, a basic HBT used in the first amplifier circuit is HBT having a rectangular emitter shape and a basic HBT used in the second amplifier circuit is HBT having a ring-like emitter shape.

Figure 35A:
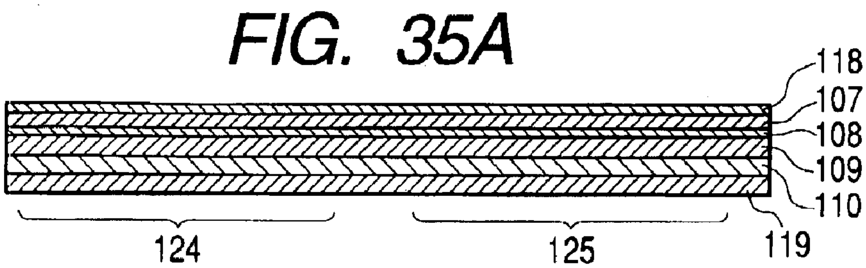
FIGS. 35A through 35H are sectional views of a device showing a method of fabricating a power amplifier which is an embodiment of the invention in an order of steps.
Figure 35B:
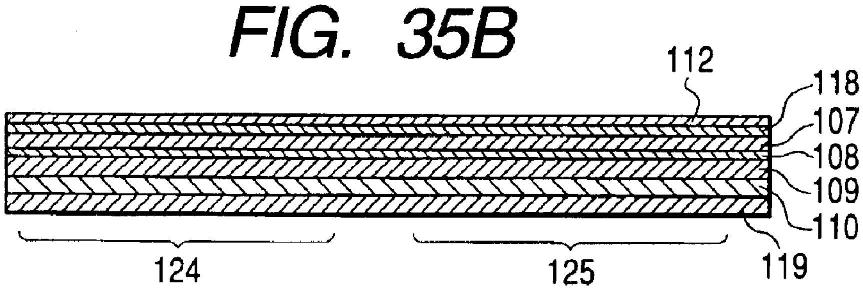

First, an n type GaAs subcollector layer (Si concentration $5\times10^{18}$ $cm^{-3}$, film thickness 0.6 $\mu m$) 110, an n-type GaAs collector layer (Si concentration $1\times10^{16}$ $cm^{-3}$, film thickness 0.8 $\mu m$) 109, a p type GaAs base layer (C concentration $4\times10^{19}$ $cm^{-3}$, film thickness 90 nm) 108, an n-type InGaP emitter layer (InP molar ratio 0.5, Si concentration $3\times10^{17}$ $cm^{-3}$, film thickness 30 nm) 107 and an n-type InGaAs emitter contact layer (InAs molar ratio 105, Si concentration $1\times10^{19}$ $cm^{-3}$, film thickness 0.2 $\mu m$) 118 are made to grow above a semiinsulating GaAs substrate 119 by a metal organic vapor phase epitaxial growth method (FIG. 35A).

Figure 35C:
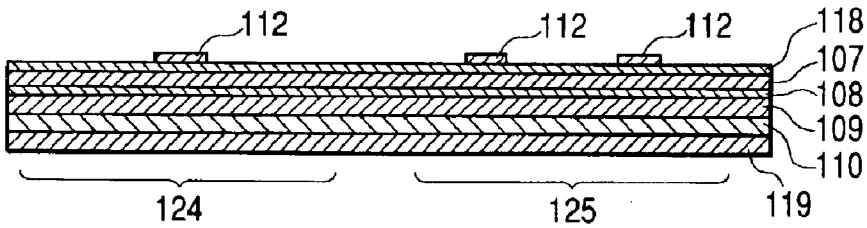

Thereafter, WSi (Si molar ratio 0.3, film thickness 0.3 $\mu m$) 112 is deposited over the entire face of a wafer by using a high-frequency sputtering method (FIG. 35B), and the WSi layer is fabricated by dry etching using photolithography and $CF_4$ to form the emitter electrode 112 (FIG. 35C).

Figure 35D:
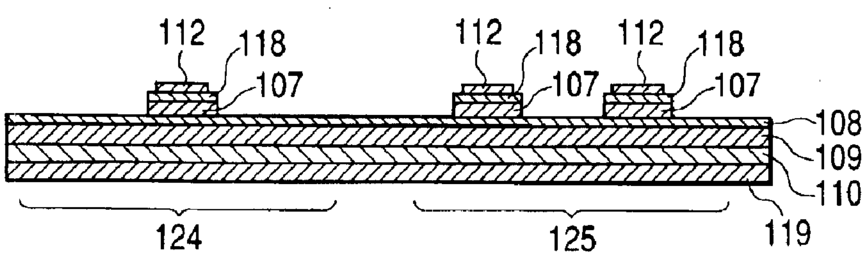

Thereafter, the n-type InGaAs emitter contact layer 118 and the n-type InGaP emitter layer 107 are fabricated in desired shapes to form the emitter region (FIG. 35D). An example of the fabricating method is as follows: An unnecessary region of the n-type InGaAs emitter contact layer 118 is removed by wet etching using photolithography and an etching solution (an example of a composition of the etching solution:phosphoric acid: hydrogen peroxide water: water= 1:2:40). Successively, an unnecessary region of the n-type InGaAs emitter layer 107 is removed by wet etching using hydrochloric acid.

Figure 35E:
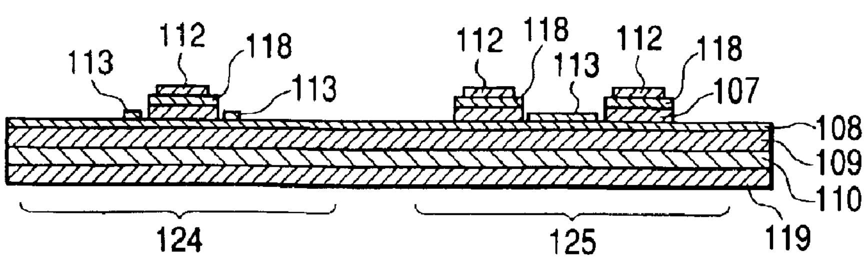

Thereafter, by using an ordinary lift-off method, the Ti (film thickness 50 nm)/Pt (film thickness 50 nm/Au (film thickness 200 nm) base electrode 113 is formed (FIG. 35E).

Figure 35F:
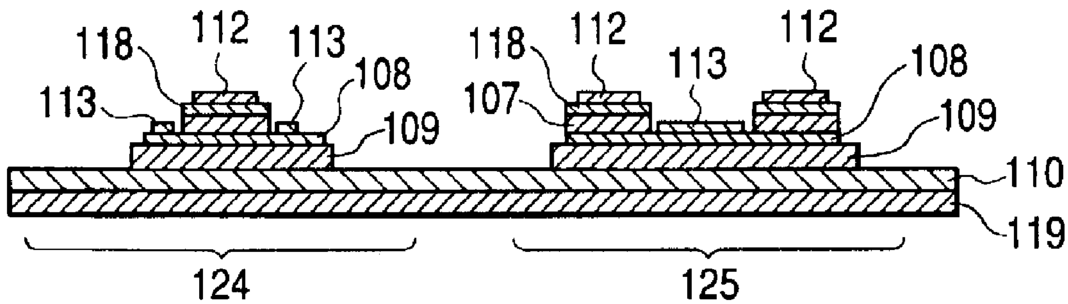

Thereafter, the base region is formed by removing the p-type GaAs base layer 108 by wet etching using photolithography and an etching solution (an example of a composition of the etching solution: phosphoric acid: hydrogen peroxide water: water=1:2:40). Further, etching is carried out as far as the n-type GaAs collector layer 109 to expose the n-type GaAs subcollector layer 110 (FIG. 35F).

Figure 35G:
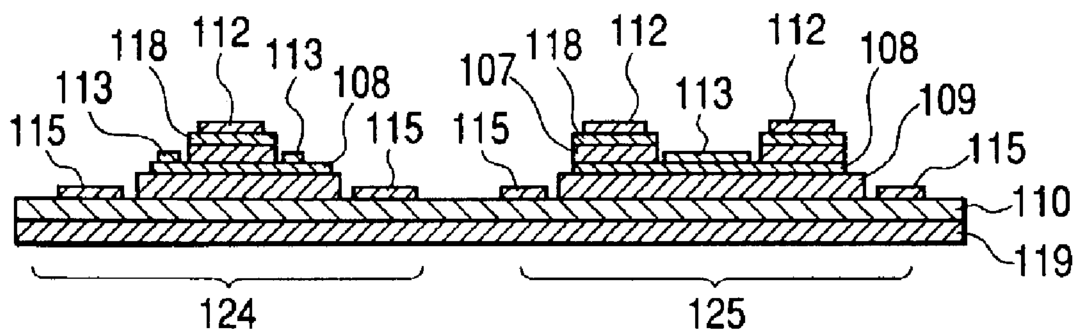

Thereafter, by an ordinary lift-off method, the collector electrode 115 is formed and alloyed at 350° C. for 30 minutes (FIG. 35G). The constitution of the collector electrode 115 is a stack of layers of AuGe (film thickness 60 nm)/Ni (film thickness 10 nm)/Au (film thickness 200 nm).

Figure 35H:
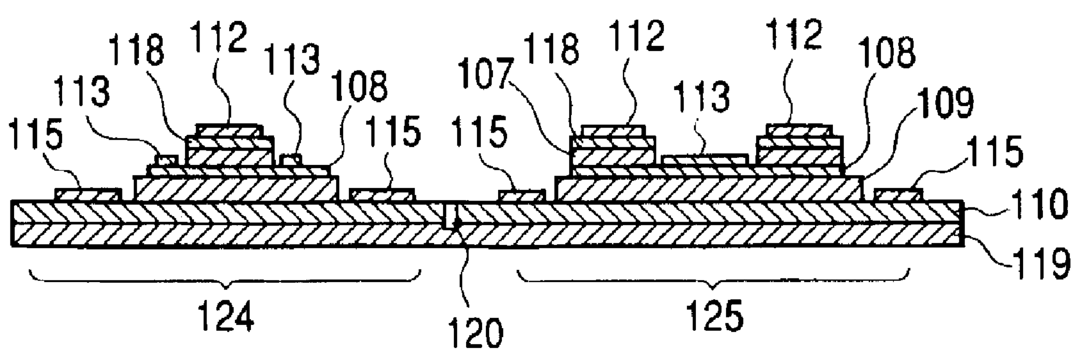

Lastly, an isolation groove 120 for isolating elements is formed. Further, wiring connecting the emitter electrodes, the base electrodes, and collector electrodes between the basic HBTs are formed (FIG. 35H). Incidentally, illustrations of the respective wiring are omitted.

Further, as explained in Embodiment 6, planar shapes of the respective portions of HBT can naturally be embodied in respective modes. Here, the detailed explanation thereof will be omitted.

Embodiment 8

In this embodiment, an explanation will be given of an example of a power amplifier constituted by combining various kinds of HBTs using the invention.

Figure 36:
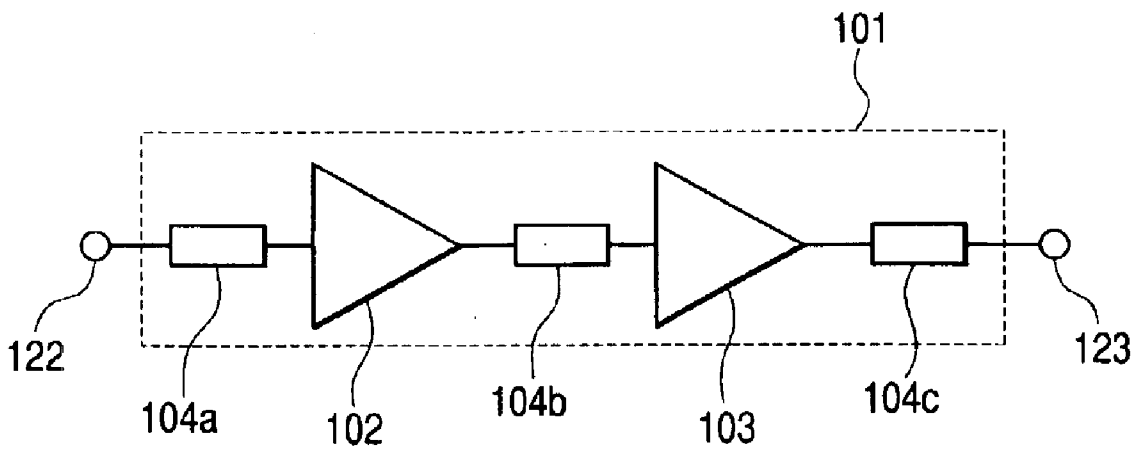
FIG. 36 is a block diagram showing an example of a power amplifier which is other embodiment of the invention.

FIG. 36 is a block diagram showing an example of a power amplifier constituted by two stages. In the figure, numerals 102 and 103 respectively designate a first amplifier circuit and a second amplifier circuit. Further, numerals 104*a*, 104*b* and 104*c* respectively designate an input matching circuit, an interstage matching circuit and an output matching circuit. A high frequency signal to be amplified is inputted from a terminal 122 to the power amplifier, amplified via the matching circuits 104*a*, 104*b* and 104*c* and the amplifier circuits 102 and 103 and outputted from a terminal 123.

The first amplifier circuit 102 is constituted by six emitter HBTs connected in parallel each having a planar shape in a rectangular shape as explained in Embodiment 1.

Figure 37:
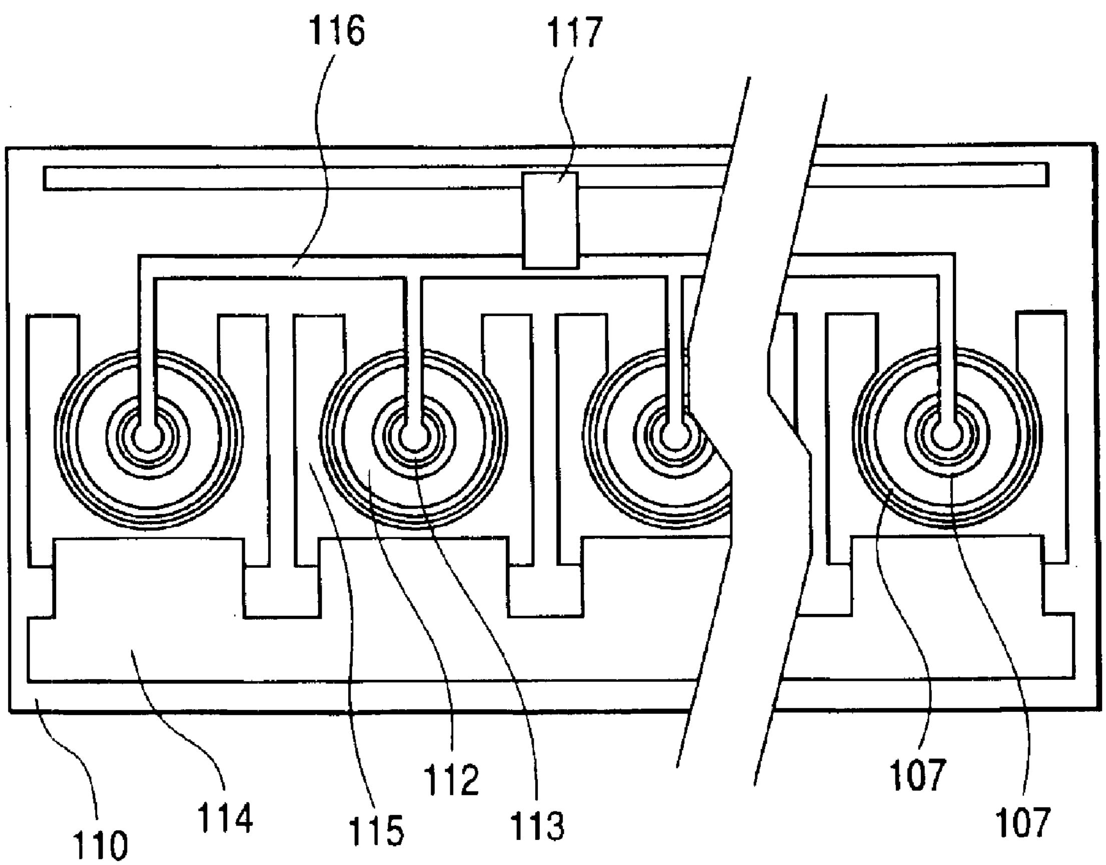
FIG. 37 is a plan view showing an example of a second amplifier circuit of a power amplifier which is another embodiment of the invention.
Figure 38:
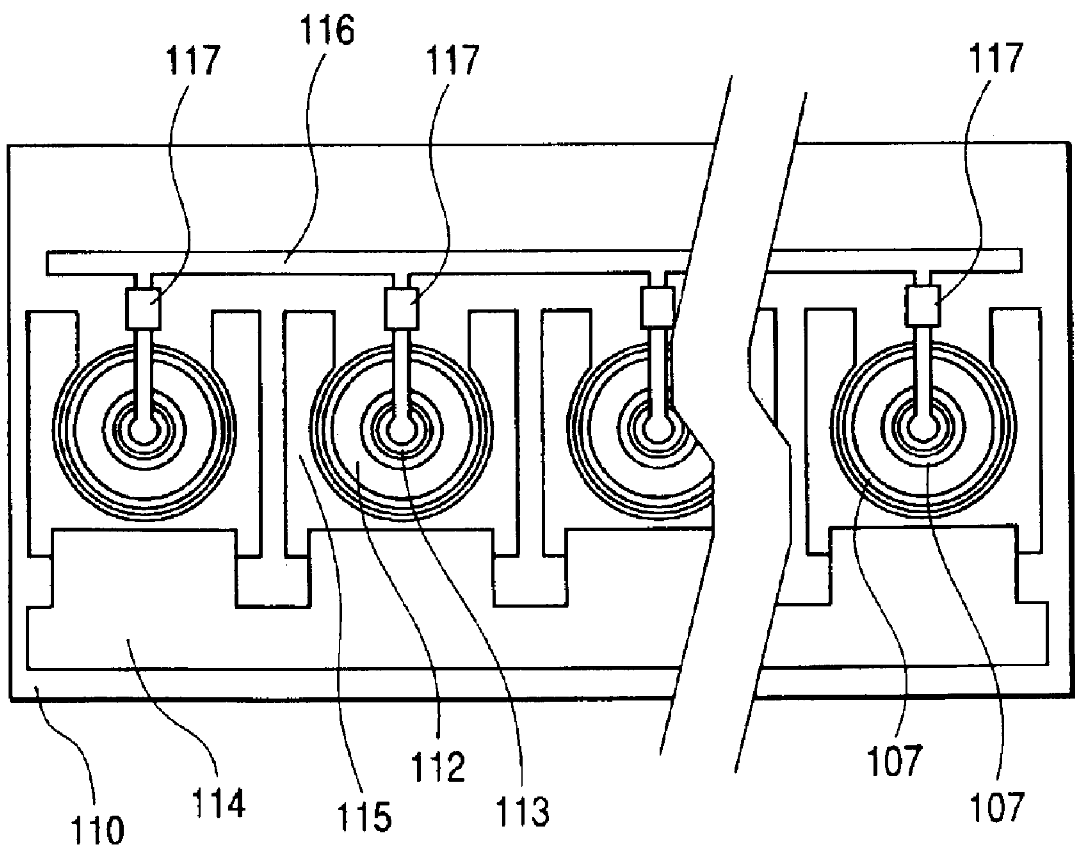
FIG. 38 is a plan view showing an example of a second amplifier circuit of a power amplifier which is another embodiment of the invention.

The second amplifier circuit 103 is constituted by 28 emitter HBTs, connected in parallel, having a planar shape in a ring-like shape as explained in Embodiment 6 or HBTs having emitters each constituting a portion of a ring-like shape and a resistor 117 is connected in series with a base wiring 116 (FIG. 37). The example of the resistor is constituted by WSiN. A resistance value thereof at room temperature is 15 Ω. The resistor 117 may be introduced for each of basic HBTs as shown by FIG. 38. In this case, a value of the WSiN resistor at room temperature is 280 Ω. The resistance value of the WSiN resistor is an example and differs depending on the required specification of the power amplifier.

Example of Characteristic of Power Amplifier Module of the Invention

An explanation will be given of a characteristic and an effect achieved by the invention in reference to drawings.

Figure 39:
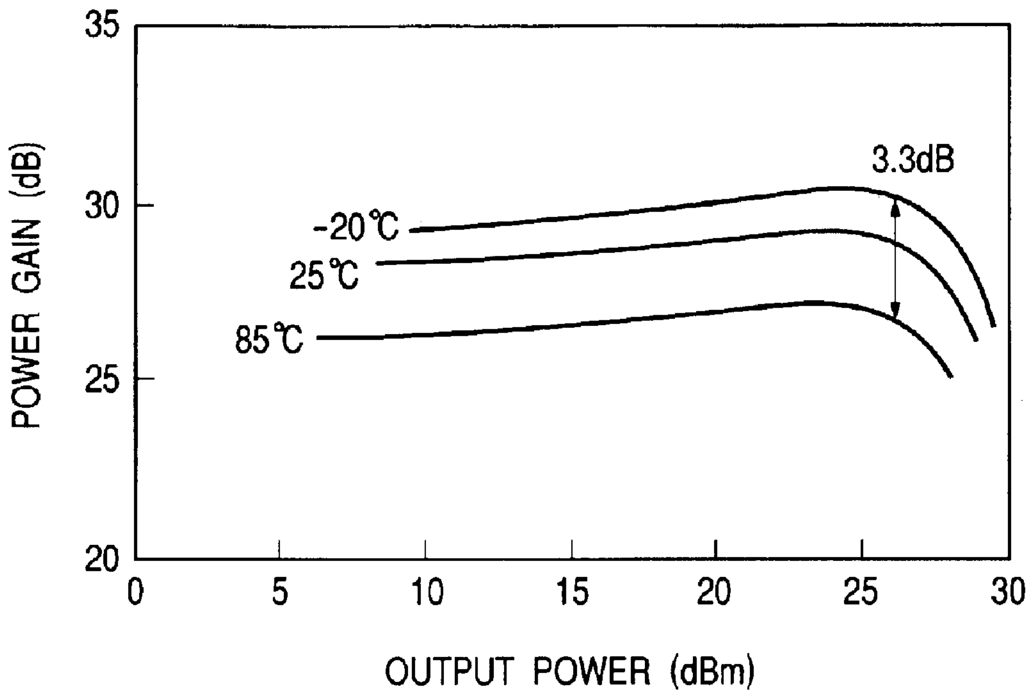
FIG. 39 is a diagram showing a result of measuring temperature dependency of a characteristic of a power amplifier having a conventional structure.
Figure 40:
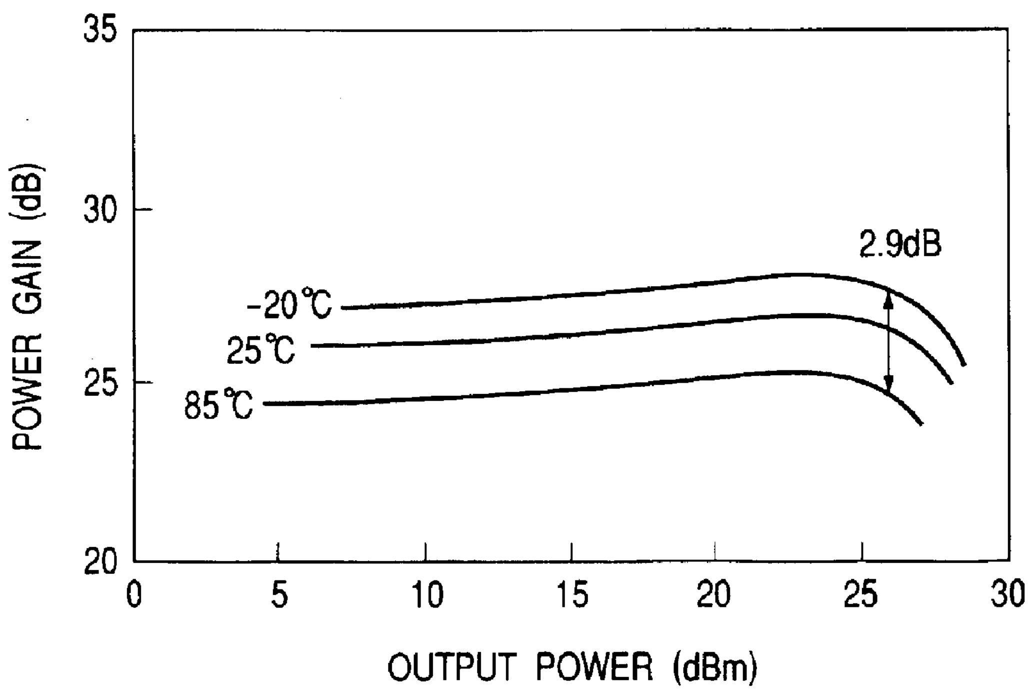
FIG. 40 is a diagram showing a result of measuring temperature dependency of a characteristic of a power amplifier of the invention.
Figure 41:
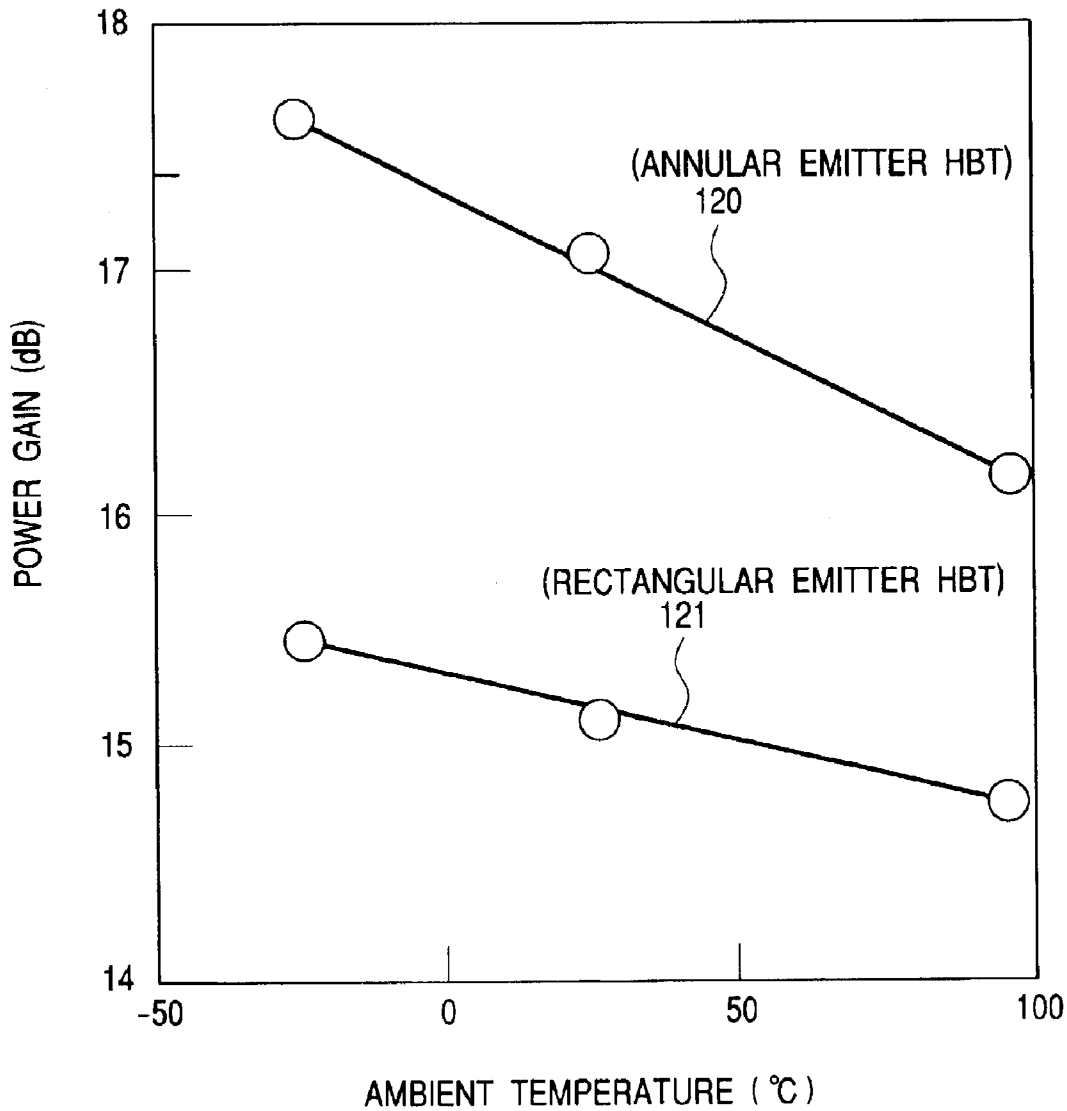
FIG. 41 is a diagram showing a result of measuring temperature dependency of power gain of a single one of HBT.

FIG. 39 and FIG. 40 comparatively show a characteristic of the power amplifier according to the prior art and that according to the present invention, respectively. Measuring conditions is such that frequency is 1.9 GHz, collector voltage is 3.4 V, and ambient temperature falls in a range of −20° C. through +85° C.

FIG. 39 shows a relationship between power gain and output power of the power amplifier of the related art. As shown by FIG. 39, when the ambient temperature is changed within the range from −20° C. to +85° C., the power gain is changed by 3.3 dB. Meanwhile, FIG. 40 shows a relationship between power gain and output voltage of the power amplifier according to the invention. As shown by FIG. 40, when the surrounding temperature is changed within the range from −20° C. to +85° C., a change in the power gain is reduced to 2.9 dB. That is, according to the invention, the change in the power gain by temperature is improved by 0.4 dB.

In this way, in the power amplifier module of the invention, the power amplifier of high performance having small temperature dependency of the power gain can be provided. Further, according to another aspect of the invention, a method of fabricating the power amplifier of high performance having small temperature dependency of power gain can be provided.

An explanation will be given of main numerals to facilitate the understanding of the drawings.

1 . . . emitter electrode, 2 . . . base electrode, 3 . . . collector electrode, 4 . . . emitter wiring, 5 . . . base wiring, 6 . . . collector wiring, 7 . . . semiconductor substrate, 8 . . . subcollector layer, 9 . . . collector layer, 10 . . . base layer, 11 . . . emitter layer, 12 . . . cap layer, 13 . . . interlayer insulating film, 14 . . . base mesa outer periphery, 15 . . . side wall, 16 . . . photoresist, 17 . . . emitter top HBT, 18 . . . resistor element, 19 . . . capacitor element, 20 . . . resistor film, 21, 22, 23 . . . capacitor laminated films, 24 . . . capacitor element lower electrode wiring, 25 . . . metal cap, 26 . . . chip part, 27 . . . transmission line, 31 . . . bonding wire, 32 . . . MMIC, 33 . . . thermal via, 28, 29, 30 . . . ground layers, 34 . . . bias line, 35 . . . high resistance parasitic emitter/base region, 36 . . . collector pad, 37 . . . base pad, 38 . . . via hole pad, 101: power amplifier, 102: first amplifier circuit, 103: second amplifier circuit, 104*a*: input matching circuit, 104*b*: interstage matching circuit, 104*c*: output matching circuit, 105: basic HBT, 106: basic HBT, 107: emitter layer, 108: base layer, 109: collector layer, 110: subcollector layer, 111: emitter wiring, 112: emitter electrode, 113: base electrode, 114: collector wiring, 115: collector electrode, 116: base wiring, 117: resistor, 118: emitter contact layer, 119: semiinsulating GaAs substrate, 120: temperature dependency of power gain of ring-like emitter HBT per se, 121: temperature dependency of power gain of rectangular emitter HBT per se, 122: high frequency signal input terminal, 123: high frequency signal output terminal, 124: first amplifier circuit forming region, 125: second amplifier circuit forming region.

What is claimed is:

1. A semiconductor device comprising:

a semiconductor substrate; and a bipolar transistor formed above the semiconductor substrate and having an emitter/base junction region having a planar shape in a ring-like shape;

wherein the semiconductor substrate is a zinc blende type semiconductor substrate having a (100) (±5 degrees) face, the bipolar transistor is an emitter top type heterojunction bipolar transistor, and a base electrode of the heterojunction bipolar transistor is present on an inner side of the ring-like emitter/base junction region.

2. The semiconductor device according to claim 1, wherein no side substantially in parallel with [011] direction (±5 degrees) is present on an outer periphery of the emitter/base junction region of the heterojunction bipolar transistor.

3. The semiconductor device according to claim 1, wherein the planar shape is a polygonal shape.

4. The power amplifier module to claim 2, wherein a planar shape of the base electrode of the bipolar transistor included by the first amplifier circuit is a quadrangular shape.

* * * * *